(12) United States Patent
Chang et al.

(10) Patent No.: US 10,568,199 B2
(45) Date of Patent: Feb. 18, 2020

(54) PRINTED CIRCUIT BOARD AND SEMICONDUCTOR PACKAGE STRUCTURE

(71) Applicant: Shanghai Zhaoxin Semiconductor Co., Ltd., Shanghai (CN)

(72) Inventors: Nai-Shung Chang, New Taipei (TW); Tsai-Sheng Chen, New Taipei (TW); Chang-Li Tan, New Taipei (TW); Yun-Han Chen, New Taipei (TW); Hsiu-Wen Ho, New Taipei (TW)

(73) Assignee: SHANGHAI ZHAOXIN SEMICONDUCTOR CO., LTD., Shanghai (CN)

( * ) Notice: Subject to any disclaimer, the term of this patent is extended or adjusted under 35 U.S.C. 154(b) by 267 days.

(21) Appl. No.: 15/802,544

(22) Filed: Nov. 3, 2017

(65) Prior Publication Data

US 2018/0374789 A1   Dec. 27, 2018

Related U.S. Application Data

(63) Continuation of application No. 15/800,677, filed on Nov. 1, 2017.

(30) Foreign Application Priority Data

Jun. 22, 2017   (TW) .............................. 106120869 A

(51) Int. Cl.
*H05K 1/02* (2006.01)
*H05K 1/11* (2006.01)
(Continued)

(52) U.S. Cl.
CPC ......... *H05K 1/0231* (2013.01); *H01L 23/145* (2013.01); *H01L 23/3114* (2013.01);
(Continued)

(58) Field of Classification Search
CPC ................. H05K 1/0231; H05K 1/114; H05K 2201/09609; H05K 2201/10015;
(Continued)

(56) References Cited

U.S. PATENT DOCUMENTS

| 8,759,689 B2 | 6/2014 | Chan et al. | |
| 2005/0162839 A1* | 7/2005 | Chan ..................... | H05K 1/0231 361/782 |
| 2011/0031610 A1* | 2/2011 | Yamazaki ........... | H01L 23/4985 257/693 |

FOREIGN PATENT DOCUMENTS

TW   586205 B   5/2004

* cited by examiner

*Primary Examiner* — Dharti H Patel
(74) *Attorney, Agent, or Firm* — McClure, Qualey & Rodack, LLP

(57) ABSTRACT

A circuit substrate and a semiconductor package structure are provided. The circuit substrate includes a body and a via hole array. The via hole array includes via hole column units periodically arranged along a first direction. Each via hole column unit includes first to sixth via holes passing through the body and electrically connected to a capacitor. Any two adjacent via holes of the first to sixth via holes transmit power and ground signals. The sixth via hole of one of the via hole column units is adjacent to the first via hole of another one of the via hole column units, which is adjacent to the one of the via hole column units. The sixth via hole of one of the via hole column units and the first via hole of another one of the via hole column units transmit power and ground signals.

23 Claims, 5 Drawing Sheets

(51) Int. Cl.
- *H05K 1/18* (2006.01)
- *H05K 3/00* (2006.01)
- *H05K 3/34* (2006.01)
- *H05K 3/40* (2006.01)
- *H01L 23/495* (2006.01)
- *H01L 23/50* (2006.01)
- *H01L 23/14* (2006.01)
- *H01L 23/31* (2006.01)
- *H01L 23/498* (2006.01)
- *H01L 23/00* (2006.01)

(52) U.S. Cl.
CPC .. *H01L 23/49589* (2013.01); *H01L 23/49833* (2013.01); *H01L 23/49838* (2013.01); *H01L 23/50* (2013.01); *H01L 24/16* (2013.01); *H05K 1/0219* (2013.01); *H05K 1/111* (2013.01); *H05K 1/181* (2013.01); *H05K 1/183* (2013.01); *H05K 3/0073* (2013.01); *H05K 3/3452* (2013.01); *H05K 3/4007* (2013.01); H01L 23/49816 (2013.01); H01L 23/49827 (2013.01); H01L 2224/16227 (2013.01); H01L 2224/16237 (2013.01); H01L 2924/15311 (2013.01); H01L 2924/15321 (2013.01); H01L 2924/15331 (2013.01); H01L 2924/181 (2013.01); H01L 2924/19041 (2013.01); H01L 2924/19102 (2013.01); *H05K 1/114* (2013.01); *H05K 3/3436* (2013.01); H05K 2201/0989 (2013.01); H05K 2201/09609 (2013.01); H05K 2201/10015 (2013.01); H05K 2201/10378 (2013.01); H05K 2201/10522 (2013.01); H05K 2201/10545 (2013.01); H05K 2201/10636 (2013.01); H05K 2201/10734 (2013.01)

(58) Field of Classification Search
CPC .......... H05K 2201/10636; H05K 2201/10545; H05K 2201/10734; H05K 2201/0989; H05K 1/181; H05K 1/0219; H05K 3/4007; H05K 3/3452; H05K 3/0073; H05K 1/183; H05K 1/111; H05K 2201/10378; H05K 3/3436; H05K 2201/10522; H01L 23/49816; H01L 23/49827; H01L 2224/16227; H01L 2924/15331; H01L 2924/19041; H01L 2924/19102; H01L 2224/16225; H01L 2924/181; H01L 2924/15311; H01L 23/145; H01L 23/49833; H01L 23/49838; H01L 24/16; H01L 23/3114; H01L 23/50; H01L 23/49589; H01L 2924/15321
USPC ........................................................ 361/767
See application file for complete search history.

PRINTED CIRCUIT BOARD AND SEMICONDUCTOR PACKAGE STRUCTURE

CROSS REFERENCE TO RELATED APPLICATIONS

This application is a continuation application of U.S. patent application Ser. No. 15/800,677 filed on Nov. 1, 2017, entitled "PRINTED CIRCUIT BOARD AND SEMICONDUCTOR PACKAGE STRUCTURE", which claims the benefit of Taiwan Patent Application No. 106120870, filed on Jun. 22, 2017, the entirety of which is incorporated by reference herein.

BACKGROUND

Technical Field

The disclosure relates to a printed circuit board and a semiconductor package structure, and in particular to a printed circuit board and a semiconductor package structure with better power integrity (PI).

Description of the Related Art

In the field of semiconductor packaging technology, the working frequency and wiring density of printed circuit boards have to be increased nowadays. This comes in response to an increasing in working frequency and power consumption of integrated circuit (IC) chips and the demands on multi-chip integrated packages and multiple input and output (I/O) chips. In the application of high-speed and high-density printed circuit boards, however, it is becoming more and more important to maintain good power integrity (PI).

Therefore, an improved printed circuit board and semiconductor package structure are required in this technical field.

BRIEF SUMMARY

Some embodiments of the disclosure provide a printed circuit board. The printed circuit board includes a body, having a first surface and a second surface opposite the first surface, wherein the first surface is configured to bond to a circuit substrate, and the second surface is configured to bond to a capacitor. The printed circuit board further includes a via hole array, including via hole column units periodically arranged along a first direction, wherein each of the via hole column units includes via holes passing through the body and electrically connected to the capacitor, and the via holes of each of the via hole column units include a first via hole, a second via hole, a third via hole, a fourth via hole, a fifth via hole and a sixth via hole arranged sequentially along the first direction, wherein any two adjacent via holes of the first to sixth via holes are configured to transmit power signals and ground (GND) signals, respectively, wherein the sixth via hole of one of the via hole column units is adjacent to the first via hole of another one of the via hole column units, which is adjacent to the one of the via hole column units, and the sixth via hole of one of the via hole column units and the first via hole of another one of the via hole column units are configured to transmit power signals and ground signals, respectively.

Some embodiments of the disclosure provide a semiconductor package structure. The semiconductor package structure includes a printed circuit board. The printed circuit board includes a body, having a first surface and a second surface opposite to each other, and a via hole array, including via hole column units periodically arranged along a first direction, wherein each of the via hole column units includes via holes passing through the body and electrically connected to the capacitor, and the via holes of each of the via hole column units include a first via hole, a second via hole, a third via hole, a fourth via hole, a fifth via hole and a sixth via hole arranged sequentially along the first direction, wherein any two adjacent via holes of the first to sixth via holes are configured to transmit power signals and ground signals, respectively. The semiconductor package structure further includes a package bonded to the first surface of the printed circuit board, and a first capacitor bonded to the second surface of the printed circuit board, wherein a first electrode and a second electrode of the first capacitor respectively cover and are electrically connected to the first via hole and the second via hole of one of the via hole column units.

To clarify the features and advantages of the present disclosure, a detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

Figure 1:
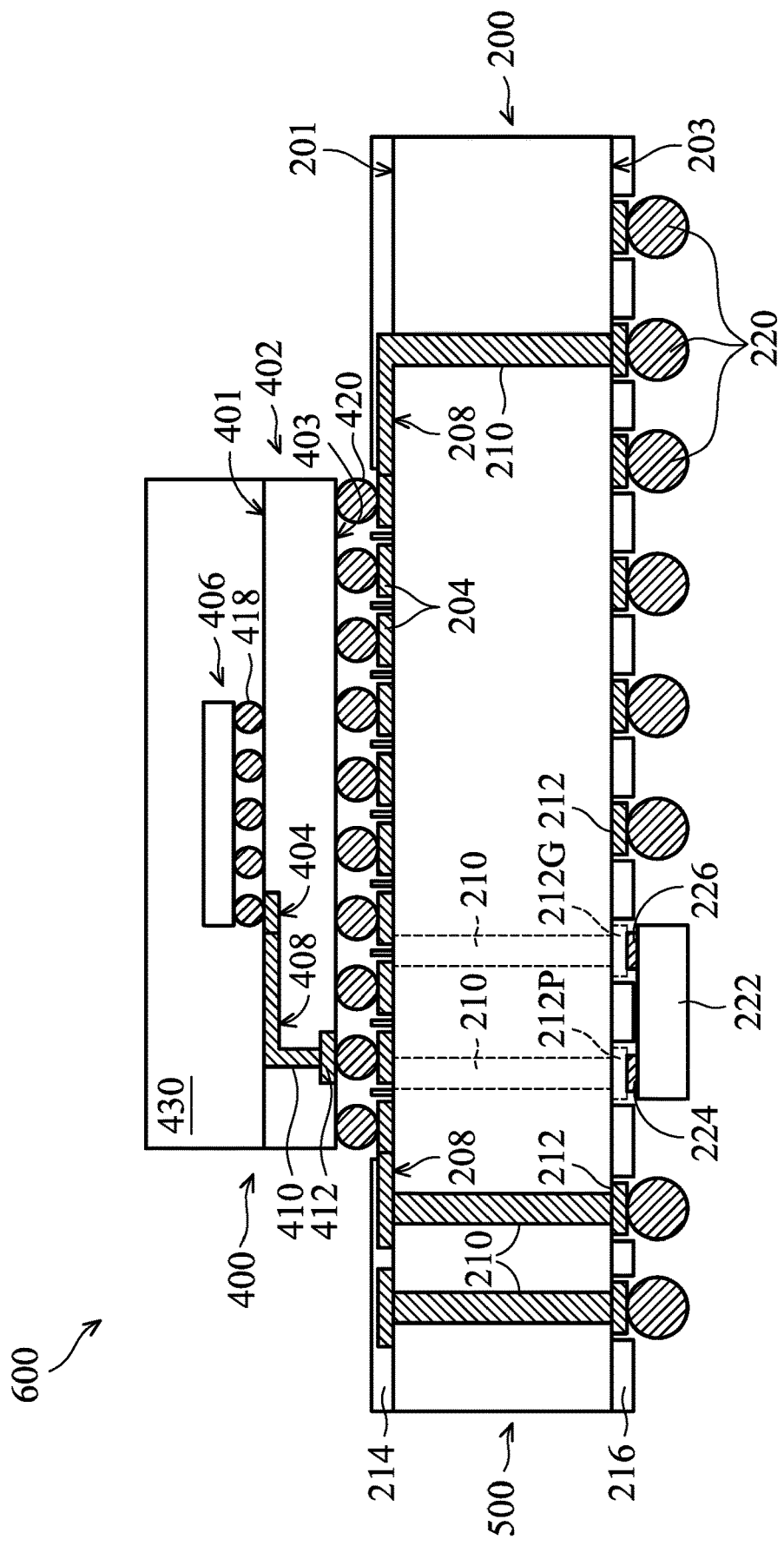
FIG. 1 is a cross-sectional view of a semiconductor package structure in accordance with some embodiments.

To clarify the purposes, features and advantages of the present disclosure, the following disclosure provides many exemplary embodiments in connection with the accompanying drawings for detail description. The specification of the present disclosure provides various embodiments for illustrating technical features of different embodiments of the present disclosure. The configuration of the various elements in the embodiments is merely example and not intended to be limiting. The repetition of the reference numerals in the embodiments is for the purpose of simplicity of illustration, and does not in itself dictate a relationship between the various embodiments.

Some embodiments of the disclosure provide a semiconductor package structure, for example, a ball grid array package structure (BGA package structure). A printed circuit board of the semiconductor package structure has power pads and ground pads electrically connected to the ball grid array package structure, and corresponding power via holes and ground via holes. In addition, the printed circuit board of the semiconductor package structure make the arrangement of the capacitors (for example, decoupling capacitors) bonded to a solder bump-side of the printed circuit board tighter using the arrangement of the power via holes and the ground via holes. The density of the capacitors can be increased, and the impedance of the power path is effectively reduced. Therefore, the printed circuit board of present disclosure has better power integrity (PI).

FIG. 1 is a cross-sectional view of a semiconductor package structure 600 in accordance with some embodiments. FIGS. 2-5 are top views of a portion of a substrate-side surface of printed circuit board 500a-500d of the semiconductor package structure shown in FIG. 1, illustrating the relationship of the positions among the pads arranged on the substrate-side surface of the printed circuit board and electrically connected to a package 400, the via holes passing through the printed circuit board and electrically connected to the corresponding pads, and the capacitors arranged on a solder bump-side surface of the printed circuit board and electrically connected to the corresponding via holes. FIGS. 2-5 additionally show the capacitors 222A-1, 222A-2, 222B, 222C and 222D-1 to 222-D-4 bonded to the solder bump-side surface of the printed circuit board to illustrate connection relationship between the power via hole and the ground via hole of the printed circuit board and the capacitors. For clarity of illustration, solder mask layers disposed over the solder bump-side surface of the printed circuit board are not shown in FIGS. 2-5. In addition, the printed circuit board of the present disclosure and a circuit substrate and a chip disposed thereon can collectively constitute a semiconductor package structure, for example, a ball grid array package structure (BGA package structure).

As shown in FIG. 1, a semiconductor package structure 600 of the present disclosure includes a printed circuit board 500, and a package 400 and a capacitor 222 disposed on opposite surfaces of the printed circuit board 500. In some embodiments, the printed circuit board 500 includes a body 200, pads 204, via holes 210, pads 212 and solder bumps 220. The body 200 has a first surface 201 and a second surface 203 opposite the first surface 201. In some embodiments, the first surface 201 of the body 200 can serve as a substrate-side surface, and the second surface 203 can be referred to as a solder bump-side surface. In some embodiments, the material of the body 200 includes paper phenolic resin, composite epoxy, polyimide resin or glass fiber.

As shown in FIG. 1, the via holes 210 of the printed circuit board 500 pass through the body 200, and the two ends of each of the via holes 210 can be aligned with the first surface 201 and the second surface 203 of the body 200, respectively. In addition, the via holes 210 are arranged corresponding to the pads 204 close to the first surface 201 and the pads 212 close to the second surface 203. Therefore, the pads 204 are electrically connected to the corresponding pads 212 through the via holes 210. In some embodiments, the via holes 210 of the printed circuit board 500 are configured to transmit ground signals or power signals. In other words, the via holes 210 of the printed circuit board 500 are not configured to transmit digital signals. For clarity of illustration, the via holes and the pads of the printed circuit board 500 configured to transmit digital signals are not shown herein. In some embodiments, the material of the via holes 210 may be copper, copper alloy or conductive materials, and the via holes 210 may be formed using laser drilling process and electroplating process.

As shown in FIG. 1, the pads 204 of the printed circuit board 500 are disposed on the first surface 201 of the body 200 and electrically connected to the package 400. Therefore, the pads 204 may also be referred to as surface-side pads. The pads 212 of the printed circuit board 500 are disposed on the second surface 203 of the body 200 and electrically connected to corresponding solder bumps 220. Therefore, the pads 212 may also be referred to as solder bump-side pads. In some embodiments, the pads 204 are electrically connected to the corresponding via holes 210 through conductive plane layer patterns 208 disposed on the first surface 201 of the body 200. The pads 204 and the conductive plane layer patterns 208 belong to the same layered-level. In the embodiments shown in FIG. 1, the pads 204 and the pads 212 of the printed circuit board 500 are configured to transmit ground signals or power signals, but not to transmit digital signals. In some embodiments, the materials of the pads 204 and the pads 212 may be copper or copper alloy. A conductive layer may be entirely formed on the first surface (substrate-side surface) 201 and the second surface (solder bump-side surface) 203 using electroplating, laminating and coating processes, respectively. Afterwards, the pads 204 are formed on the first surface (substrate-side surface) 201 and the pads 212 are formed on the second surface (solder bump-side surface) 203 using an image transfer process including photoresist coating, developing, etching and stripping processes. Also, the conductive plane layer patterns 208 are formed during forming the pads 204.

As shown in FIG. 1, the printed circuit board 500 of the semiconductor package structure 600 further includes a solder mask layer 214 disposed on the first surface (substrate-side surface) 201 and a solder mask layer 216 disposed on the second surface (solder bump-side surface) 203. The solder mask layer 214 disposed on the first surface 201 covers a portion of the conductive plane layer patterns 208. The solder mask layer 214 may have one or more openings. The pads 204 may be partially exposed or fully exposed at the openings. Also, the openings may be separated from the pads 204 by a distance. Therefore, the solder mask layer 214 can prevent the underlying conductive plane layer patterns 208 from oxidation. The solder mask layer 216 disposed on the second surface (solder bump-side surface) 203 may have one or more openings. The pads 212 are exposed at the openings. Also, the openings may be separated from the pads 212 by a distance. The solder mask layer 216 can prevent the solder bumps 220 disposed on the pads 212 from short-circuiting with other conductive lines and solder bumps. Furthermore, the openings of the solder mask layer 216 can provide forming positions for subsequent solder bumps. In some embodiments, the solder mask layers 214 and 216 may include solder-resistant materials such as solder mask, or insulating materials including polyimide, Ajinomoto build-up film (ABF), epoxy or acrylic resin or the composite of the former two, or polypropylene (PP). The solder mask layers 214 and 216 may be formed by a coating process, a printing process, an adhesion process, a laminating process or other proper processes.

As shown in FIG. 1, the package 400 of the semiconductor package structure 600 is disposed on the first surface 201 of the body 200 of the printed circuit board 500, and electrically connected to the pads 204 of the printed circuit board 500. In the embodiments, the package 400 is a ball grid array package structure (BGA package structure). In some embodiments, the package 400 includes a circuit substrate 402 and a chip 406. The circuit substrate 402 has a chip-side surface 401 and a solder bump-side surface 403 opposite to the chip-side surface 401. As shown in FIG. 1, the chip 406 is disposed on the chip-side surface 401 of the circuit substrate 402 and electrically connected to a chip-side pad 404 of the circuit substrate 402 through the solder bump 418. In the embodiments, the chip 406 can be electrically connected to the solder balls 420 disposed on the solder bump-side surface 403 through the chip-side pad 404 close to the chip-side surface 401, a conductive plane layer pattern 408, a via hole plug 410 passing through the circuit substrate 402 and a pad 412 close to the solder bump-side surface 403. In addition, the solder balls 420 are electrically connected to the corresponding pads 204 of the printed circuit board 500.

In the embodiments shown in FIG. 1, the chip-side pad 404, the conductive plane layer pattern 408, the via hole plug 410 and the pad 412 of the circuit substrate 402 are configured to transmit ground signals or power signals. In other words, they are not configured to transmit digital signals. For clarity of illustration, the conductive plane layer pattern, the via hole plug and the pad of the circuit substrate 402 configured to transmit digital signals are not shown herein.

As shown in FIG. 1, an encapsulated material 430 is disposed on the chip-side surface 401 of the circuit substrate 402. The encapsulated material 430 covers and surrounds the chip 406. In some embodiments, the encapsulated material 430 may be formed by any nonconductive materials, for example, epoxy, resin, moldable polymer or similar materials.

As shown in FIG. 1, the semiconductor package structure 600 further includes the capacitor 222 bonded to the second surface (solder bump-side surface) 203 of the printed circuit board 500. In some embodiments, the capacitor 222 may be a decoupling capacitor. Decoupling capacitors can store excess electric energy in the capacitors, and, when the power supply is insufficient, feedback to the power supply system, and the impedance of the power path can be reduced. The capacitor 222 has a first electrode 224 and a second electrode 226. The first electrode 224 of the capacitor 222 is electrically connected to a power pad 212P disposed on the second surface (solder bump-side surface) 203 of the printed circuit board 500, and the second electrode 226 of the capacitor 222 is electrically connected to a ground pad 212G disposed on the second surface (solder bump-side surface) 203 of the printed circuit board 500.

FIGS. 2-5 illustrates the relationship of the positions among the pads 204, which are arranged on the substrate-side surface 201 of the printed circuit board 500 and electrically connected to the package (ball grid array package structure) 400, the via holes 210, which are formed passing through the printed circuit board 500 and electrically connected to the corresponding pads 204, and the capacitors 222, which are arranged on the solder bump-side surface 203 of the printed circuit board 500 and electrically connected to the corresponding via holes 210. FIGS. 2-5 are top views of portions of the first surfaces 201 of printed circuit boards 500a-500d in accordance with some embodiments. For the convenience of illustration, the solder mask layer 214 disposed on the solder bump-side 203 of the printed circuit boards 500a-500d is not shown herein.

Figure 2:
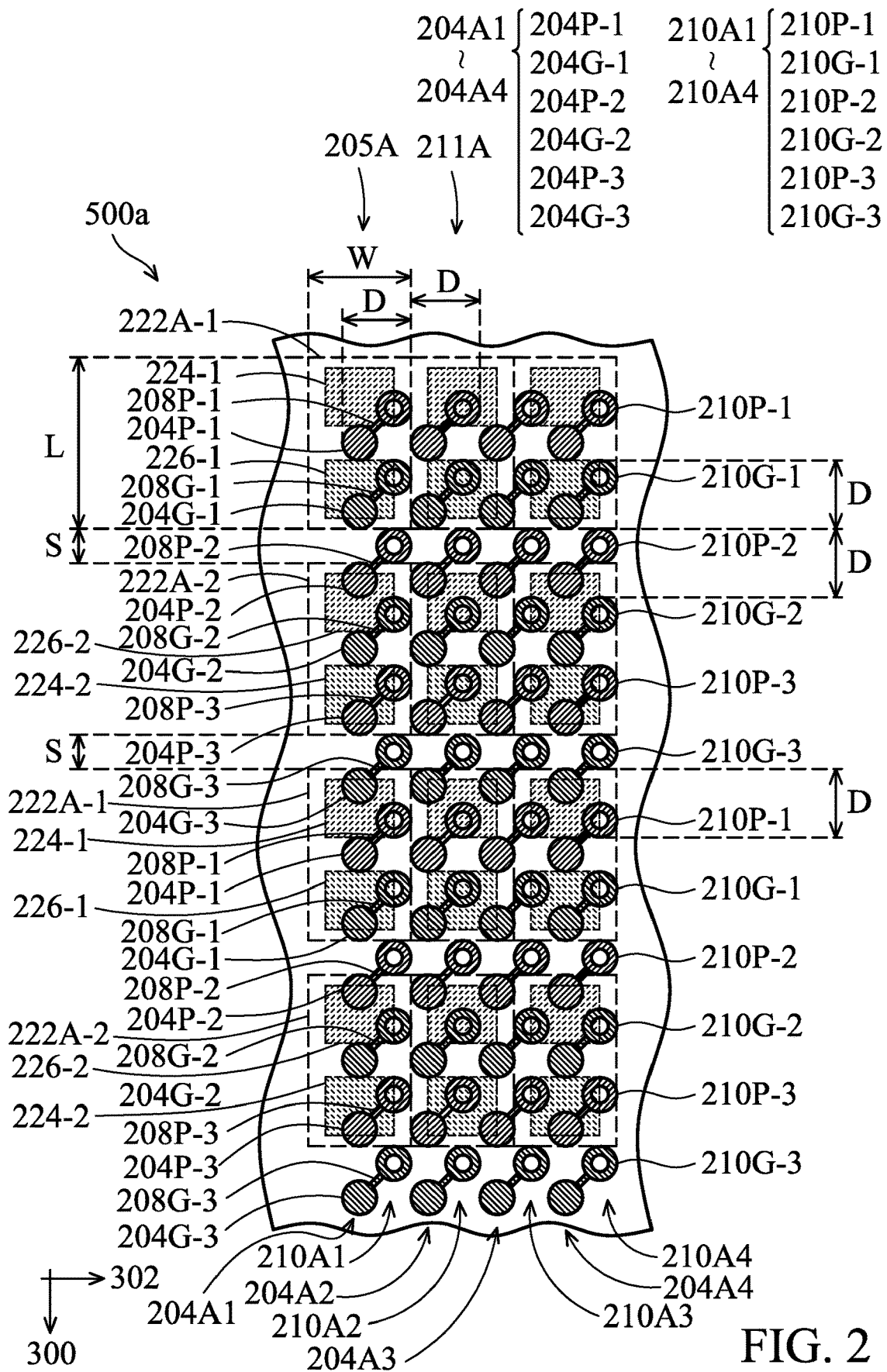
FIGS. 2-5 are top views of a printed circuit board of a semiconductor package structure in accordance with some embodiments.

FIG. 2 is a top view of a portion of the first surface 201 of the printed circuit board 500a in accordance with some embodiments. In some embodiments, the pads 204 arranged on the substrate-side surface 201 of the body 200 of the printed circuit board 500a and electrically connected to the package (ball grid array package structure) 400 are arranged as a pad array 205A. The pad array 205A may be formed by pad column units, which are periodically arranged along a first direction 300 and a second direction 302, for example, the pad column units 204A1, 204A2, 204A3 and 204A4 shown in FIG. 2. The term "pad column unit" referred to herein means a specific arrangement of the pads. The pads of the pad column unit are arranged in a row along a lengthwise direction. Also, the pads in different positions of the pad column unit are assigned to transmit power signals or ground signals, respectively. In some embodiments, each of the pad column units of the printed circuit board 500a includes a plurality of pads arranged in a row along the first direction 300. For example, as shown in FIG. 2, each of the pad column units 204A1, 204A2, 204A3 and 204A4 of the pad array 205A are composed of six pads arranged in a row along the first direction 300. The six pads respectively are pads 204P-1, 204G-1, 204P-2, 204G-2, 204P-3 and 204G-3 arranged sequentially along the first direction 300. In addition, the pads 204P-1, 204G-1, 204P-2, 204G-2, 204P-3 and 204G-3 of each of the pad column units 204A1, 204A2, 204A3 and 204A4 are arranged with a pitch D. Furthermore, for clarity of illustration, the pad array 205A shown in FIG. 2 is illustrated as two pad column units (i.e. the upper pad column unit 204A1 and the lower pad column unit 204A1) periodically arranged along the first direction 300, and four pad column units (i.e. the pad column units 204A1, 204A2, 204A3 and 204A4) periodically arranged along the second direction 302 as an example, but not limited herein. In some other embodiments, the numbers of rows and columns of the pad column units of the pad array 205A may also be changed as required.

In some embodiments, the pads 204P-1 to 204P-3 of each of the pad column units 204A1, 204A2, 204A3 and 204A4 are configured to transmit power signals, and the pads 204G-1 to 204G-3 are configured to transmit ground signals. Therefore, any two adjacent pads of the pads 204P-1 to 204P-3 and 204G-1 to 204G-3 are configured to transmit power signals and ground signals, respectively. For example, the pad 204P-1 and the pad 204G-1 adjacent to the pad 204P-1 are respectively configured to transmit power signals and ground signals. The opposite side of the pad 204G-1 configured to transmit ground signals are adjacent to the pads 204P-1 and 204P-2 configured to transmit power signals. The type of signal transmitted by the other two adjacent pads of the pad column units is analogous to the above-mentioned relationship.

In some other embodiments, the positions of the pads 204P-1 to 204P-3 of each of the pad column units 204A1, 204A2, 204A3 and 204A4 may be exchanged with that of the pads 204G-1 to 204G-3, respectively, as long as the arrangement of the pad column units 204A1, 204A2, 204A3 and 204A4 are all the same, and any two adjacent via holes are respectively configured to transmit power signals and ground signals.

In some embodiments, the pad column units of the printed circuit board 500a can be periodically repeatedly arranged along the first direction 300. For example, the pad column units 204A1, 204A2, 204A3 and 204A4 can be periodically repeatedly arranged in a row along the first direction 300. In some embodiments, the adjacent pads disposed in different pad column units along the first direction 300 are arranged with the pitch D. For example, the pad 204G-3 of the pad column unit 204A1 (the upper pad column unit 204A1 in the figure) and the pad 204P-1 of the pad column unit 204A1 (the lower pad column unit 204A1 in the figure) are adjacent to each other and arranged with the pitch D.

In some embodiments, the adjacent pads disposed in the different pad column units are respectively configured to transmit power signals and ground signals. For example, as shown in FIG. 2, the pad 204G-3 disposed in the upper pad column unit 204A1 in the figure is configured to transmit ground signals, and the pad 204P-1 disposed in the lower pad column unit 204A1 in the figure is configured to transmit power signals. The type of signal transmitted by the other two adjacent pads disposed in the different pad column units along the first direction 300 is analogous to the above-mentioned relationship.

In some embodiments, the pad column units of the printed circuit board 500a can be periodically repeatedly arranged along the second direction 302. For example, as shown in FIG. 2, the pad column unit 204A1 is adjacent to the pad column unit 204A2 along the second direction 302. The pad column unit 204A2 is adjacent to the pad column unit 204A3 along the second direction 302. The pad column unit 204A3 is adjacent to the pad column unit 204A4 along the second direction 302. In some embodiments, the adjacent pads disposed in the different pad column units along the second direction 302 are arranged with the pitch D. For example, the pad 204P-1 of the pad column unit 204A1 and the pad 204P-1 of the pad column unit 204A2 are adjacent to each other and arranged with the pitch D.

In some embodiments, the adjacent pads disposed in the different pad column units along the second direction 302 are all configured to transmit power signals or configured to transmit ground signals. For example, as shown in FIG. 2, the pad 204P-1 of the pad column unit 204A1 is adjacent to the pad 204P-1 of the pad column unit 204A2 along the second direction 302. The pad 204P-1 of the pad column unit 204A1 and the pad 204P-1 of the pad column unit 204A2 are both configured to transmit power signals. The pad 204G-1 of the pad column unit 204A1 is adjacent to the pad 204G-1 of the pad column unit 204A2 along the second direction 302. The pad 204G-1 of the pad column unit 204A1 and the pad 204G-1 of the pad column unit 204A2 are both configured to transmit ground signals. The type of signal transmitted by the other two adjacent pads disposed in the different pad column units along the second direction 302 is analogous to the above-mentioned relationship.

In some embodiments, the via holes 210, which are arranged on the substrate-side surface 201 of the body 200 of the printed circuit board 500a and electrically connected to the pads 204, are arranged as a via hole array 211A. The via hole array 211A can be formed by multiple via hole column units periodically arranged along the first direction 300 and the second direction 302. For example, the via hole array 211A can be formed by the via hole column units 210A1, 210A2, 210A3 and 210A4 shown in FIG. 2. The term "via hole column unit" referred to herein means a specific arrangement of the via holes. The via holes are arranged in a row along a lengthwise direction. Also, the via holes in different positions are assigned to transmit power signals or ground signals, respectively. In some embodiments, the via hole column units 210A1, 210A2, 210A3 and 210A4 are respectively separated from the pad column units 204A1, 204A2, 204A3 and 204A4 by a fixed distance. In some embodiments, the via hole column units of the printed circuit board 500a include a plurality of via holes arranged in a row along the first direction 300. For example, as shown in FIG. 2, each of the via hole column units 210A1, 210A2, 210A3 and 210A4 of the via hole array 211A is composed of six via holes arranged in a row along the first direction 300. The six via holes respectively are via holes 210P-1, 210G-1, 210P-2, 210G-2, 210P-3 and 210G-3 sequentially arranged along the first direction 300. The via holes 210P-1, 210G-1, 210P-2, 210G-2, 210P-3 and 210G-3 of each of the via hole column units 210A1, 210A2, 210A3 and 210A4 are arranged with the pitch D, wherein, for clarity of illustration, the via hole array 211A shown in FIG. 2 is illustrated as two via hole column units (i.e. the upper via hole column unit 210A1 and the lower via hole column unit 210A1) periodically arranged along the first direction 300, and four via hole column units (i.e. the via hole column units 210A1, 210A2, 210A3 and 210A4) periodically arranged along the second direction 302 as an example, but not limited herein. In some other embodiments, the numbers of rows and columns of the via hole column units of the via hole array 211A may also be changed as required.

In some embodiments, the via hole column units of the printed circuit board 500a can be periodically repeatedly arranged along the first direction 300. For example, the via hole column units 210A1, 210A2, 210A3 and 210A4 can be periodically repeatedly arranged in a row along the first direction 300. In some embodiments, the adjacent via holes disposed in different via hole column units are arranged with the pitch D along the first direction 300. For example, the via hole 210G-3 of the via hole column unit 210A1 (the upper via hole column unit 210A1 in the figure) and the via hole 210P-1 of the another via hole column unit 210A1 (the lower via hole column unit 210A1 in the figure) are adjacent to each other and arranged with the pitch D.

In some embodiments, the via hole column units of the printed circuit board 500a can be periodically repeatedly arranged along the second direction 302. For example, as shown in FIG. 2, the via hole column unit 210A1 is adjacent to the via hole column unit 210A2 along the second direction 302. The via hole column unit 210A2 is adjacent to the via hole column unit 210A3 along the second direction 302. In addition, the via hole column unit 210A3 is adjacent to the via hole column unit 210A4 along the second direction 302. In some embodiments, the adjacent via holes disposed in the different via hole column units are arranged with the pitch D. For example, the via hole 210P-1 of the via hole column unit 210A1 and the via hole 210P-1 of the pad column unit 210A2 are adjacent to each other and arranged with the pitch D.

In some embodiments, the pads disposed in the pad column units are arranged in a staggered arrangement with the corresponding via holes disposed in the via hole column units along the first direction 300. For example, the pads 204P-1, 204G-1, 204P-2, 204G-2, 204P-3 and 204G-3 of the pad column unit 204A1 and the via holes 210P-1, 210G-1, 210P-2, 210G-2, 210P-3 and 210G-3 of the via hole column unit 210A1 shown in FIG. 2 are arranged in a staggered arrangement along the first direction 300. In addition, as viewed along the first direction 300, the first pad 204P-1 of the pad column unit 204A1 is disposed between the first via hole 210P-1 and the second via hole 210G-1 of the via hole column unit 210A1. The relationship of the positions between the pads of the other pad column units and the via holes of the corresponding via hole column units is analogous to the above-mentioned relationship.

In some embodiments, each of the pads of the pad column units is separated from the corresponding via hole of the corresponding via hole column unit by a fixed distance along the first direction 300 and along the second direction 302, respectively. For example, as shown in FIG. 2, the pads 204P-1 of the pad column units 204A1 are separated from the via holes 210P-1 of the via hole column units 210A1 by half of the pitch D along the first direction 300 and half of the pitch D along the second direction 302, respectively. The relationship of the positions between the pads of the other pad column units and the via holes of the corresponding via hole column units is analogous to the above-mentioned relationship.

As shown in FIG. 2, in some embodiments, each of the pads of the pad column units is electrically connected to the corresponding pad of the corresponding pad column unit through the conductive plane layer patterns. In addition, the pads of the pad column units have one-to-one connection to the via holes of the corresponding via hole column units. For example, the six pads 204P-1, 204G-1, 204P-2, 204G-2, 204P-3 and 204G-3 of the pad column units 204A1 are electrically connected to the via holes 210P-1, 210G-1, 210P-2, 210G-2, 210P-3 and 210G-3 of the via hole column unit 210A1 through the conductive plane layer patterns 208P-1, 208G-1, 208P-2, 208G-2, 208P-3 and 208G-3, respectively. The relationship of the electrical connections between the pads of the other pad column units and the via holes of the corresponding via hole column units is analogous to the above-mentioned relationship.

In some embodiments, the via holes 210P-1 to 210P-3 of each of the via hole column units 210A1, 210A2, 210A3 and 210A4 are configured to transmit power signals, and the via holes 210G-1 to 210G-3 of each of the via hole column units 210A1 are configured to transmit ground signals due to the relationship of the electrical connections between the pads of the pad column units and the via holes of the corresponding via hole column units. Accordingly, any two adjacent via holes of the via holes 210P-1 to 210P-3 and 210G-1 to 210G-3 are configured to transmit power signals and ground signals, respectively. For example, the adjacent via holes 210P-1 and 210G-1 are configured to transmit power signals and ground signals, respectively. The opposite sides of the via hole 210G-1 configured to transmit ground signals are adjacent to the via holes 210P-1 and 210P-2 configured to transmit power signals. The type of signals transmitted by the other two adjacent via holes of the via hole column units is analogous to the above-mentioned relationship.

In some embodiments, the adjacent via holes disposed in different via hole column units that are adjacent in the first direction 300 are configured to transmit power signals and ground signals, respectively. For example, as shown in FIG. 2, the via hole 210G-3 in the upper via hole column unit 210A1 in the figure is configured to transmit ground signals, and the via hole 210P-1 in the lower via hole column unit 210A1 is configured to transmit power signals. The type of signals transmitted by the two adjacent via holes disposed in the different via hole column units that are adjacent to each other in the first direction 300 is analogous to the above-mentioned relationship.

In some embodiments, the adjacent via holes disposed in different via hole column units along the second direction 302 are all configured to transmit power signals or configured to transmit ground signals. For example, as shown in FIG. 2, the via hole 210P-1 of the via hole column unit 210A1 is adjacent to the via hole 210P-1 of the via hole column unit 210A2 along the second direction 302. Also, the via hole 210P-1 of the via hole column unit 210A1 and the via hole 210P-1 of the via hole column unit 210A2 are both configured to transmit power signals. For example, the via hole 210G-1 of the via hole column unit 210A1 is adjacent to the via hole 210G-1 of the via hole column unit 210A2 along the second direction 302. Also the via hole 210G-1 of the via hole column unit 210A1 and the via hole 210G-1 of the via hole column unit 210A2 are both configured to transmit ground signals. The type of signals transmitted by the two adjacent via holes disposed in the different via hole column units that are adjacent to each other in the second direction 302 is analogous to the above-mentioned relationship.

FIG. 2 illustrates the relationship of the position between the via holes 210P-1 to 210P-3 and 210G-1 to 210G-3 of each of the via hole column units 210A1, 210A2, 210A3 and 210A4, which are formed passing through the printed circuit board 500a, and the capacitors 222A-1 and 222A-2, which are bonded to the solder bump-side surface 203 of the printed circuit board 500a and electrically connected to the corresponding via holes. That is, each of the via hole column units 210A1, 210A2, 210A3 and 210A4 corresponds to the two capacitors 222A-1 and 222A-2. As shown in FIG. 2, in some embodiments, each of the via hole column units 210A1, 210A2, 210A3 and 210A4 is electrically connected to the two capacitors 222A-1 and 222A-2, which are sequentially arranged along the first direction 300. Therefore, the capacitors 222A-1 and 222A-2 can be periodically arranged corresponding to the numbers of rows and columns of the via hole column units. In addition, each of the capacitors 222A-1 and 222A-2 has a length L along the first direction 300 and a width W along the second direction 302, respectively. The length L of each of the capacitors 222A-1 and 222A-2 may be greater than or equal to twice of the pitch D between the pads on the substrate-side surface 201. In addition, the length L of each of the capacitors 222A-1 and 222A-2 may be less than three times of the pitch D. The width W of each of the capacitors 222A-1 and 222A-2 may be greater than or equal to the pitch D between the pads on the substrate-side surface 201. In addition, the width W of each of the capacitors 222A-1 and 222A-2 may be less than twice of the pitch D. For example, the size of each of the capacitors 222A-1 and 222A-2 can completely cover the 3 (column)×2 (row) pads disposed on the substrate-side surface 201.

In some embodiments, the capacitor 222A-1 has a first electrode 224-1 and a second electrode 226-1. The capacitor 222A-2 has a first electrode 224-2 and a second electrode 226-2. In the embodiments shown in FIG. 2, the first electrode 224-1 and the second electrode 226-1 of the capacitor 222A-1 cover and are electrically connected to the first via hole 210P-1 and the second via hole 210G-1 arranged along the first direction 300 in the via hole column unit 210A1, respectively. In other words, the first electrode 224-1 of the capacitor 222A-1 overlaps and is electrically connected to the via hole 210P-1 configured to transmit power signals. The second electrode 226-1 of the capacitor 222A-1 overlaps and is electrically connected to the via hole 210G-1 configured to transmit ground signals. Therefore, the via holes 210P-1 and 210G-1 of the via hole column unit 210A1, which are respectively electrically connected to the first electrode 224-1 and the second electrode 226-1 of the capacitor 222A-1, are disposed within a boundary of the capacitor 222A-1.

Furthermore, in the embodiments shown in FIG. 2, the first electrode 224-2 and the second electrode 226-2 of the capacitor 222A-2 cover and are electrically connected to the fifth via hole 210P-3 and the fourth via hole 210G-2 arranged along the first direction 300 in the via hole column unit 210A1, respectively. In other words, the first electrode 224-2 of the capacitor 222A-2 overlaps and is electrically connected to the via hole 210P-3 configured to transmit power signals, and the second electrode 226-2 of the capacitor 222A-2 overlaps and is electrically connected to the via hole 210G-2 configured to transmit ground signals. Therefore, the via holes 210P-3 and 210G-2 of the via hole column unit 210A1, which are respectively electrically connected to the first electrode 224-2 and the second electrode 226-2 of the capacitor 222A-2, are disposed within a boundary of the capacitor 222A-2.

It should be noted that in the embodiments shown in FIG. 2, the third via hole 210P-2 configured to transmit power signals and the sixth via hole 210G-3 configured to transmit ground signals in the via hole column unit 210A1 along the first direction 300 do not overlap and are not electrically connected to the first electrode and the second electrode of any of the capacitors 222A-1 and 222A-2. Therefore, the capacitors 222A-1 and 222A-2 electrically connected to the same via hole column unit 210A1 are separated from each other by a distance S. In some embodiments, the distance S may be greater than or equal to half of the pitch D between the pads on the substrate-side surface 201. In addition, the distance S may be less than the pitch D. In addition, the second electrode 226-1 of the capacitor 222A-1, which is coupled to the via hole 210G-1 transmitting ground signals, is adjacent to the second electrode 226-2 of the capacitor 222A-2, which is coupled to the via hole 210G-2 transmitting ground signals. The relationship of the electrical connections between the via holes in the same via hole column unit and the first electrode and the second electrode of the corresponding capacitors is analogous to the above-mentioned relationship. Also, the distance between the two capacitors is analogous to the above-mentioned relationship.

In some embodiments, as shown in FIG. 2, the first electrode 224-2 of the capacitor 222A-2 electrically connected to the upper via hole column unit 210A1 is adjacent to the first electrode 224-1 of the capacitor 222A-1 electrically connected to the lower via hole column unit 210A1. The relationship of the electrical connections between the via holes in the different via hole column unit that are adjacent to each other in the first direction 300 and the first electrode and the second electrode of the corresponding capacitors is analogous to the above-mentioned relationship.

In some embodiments, the capacitors 222A-1 and 222A-2 electrically connected to the via hole column unit 210A2 and the capacitors 222A-1 and 222A-2 electrically connected to the via hole column unit 210A1 have the same arrangement. For example, the first electrode 224-1 and the second electrode 226-1 of the capacitors 222A-1 electrically connected to the via hole column unit 210A2 cover and are electrically connected to the via holes 210P-1 and 210G-1 of the via hole column unit 210A2, respectively. The first electrode 224-2 and the second electrode 226-2 of the capacitors 222A-2 electrically connected to the via hole column unit 210A2 cover and are electrically connected to the fifth via holes 210P-3 and the fourth via hole 210G-2 arranged in the via hole column unit 210A2 along the first direction 300, respectively. In addition, the adjacent capacitors along the second direction 302 can be continuously arranged and do not need to be separated from each other. For example, the capacitor 222A-1 electrically connected to the via hole column unit 210A2 and the capacitor 222A-1 electrically connected to the via hole column unit 210A1 can be continuously arranged and connected to each other. The relationship of the electrical connections between the via holes in the different via hole column units arranged along the second direction 302 and the first electrode and the second electrode of the corresponding capacitors is analogous to the above-mentioned relationship. Also, the distance between two capacitors is analogous to the above-mentioned relationship.

Figure 3:
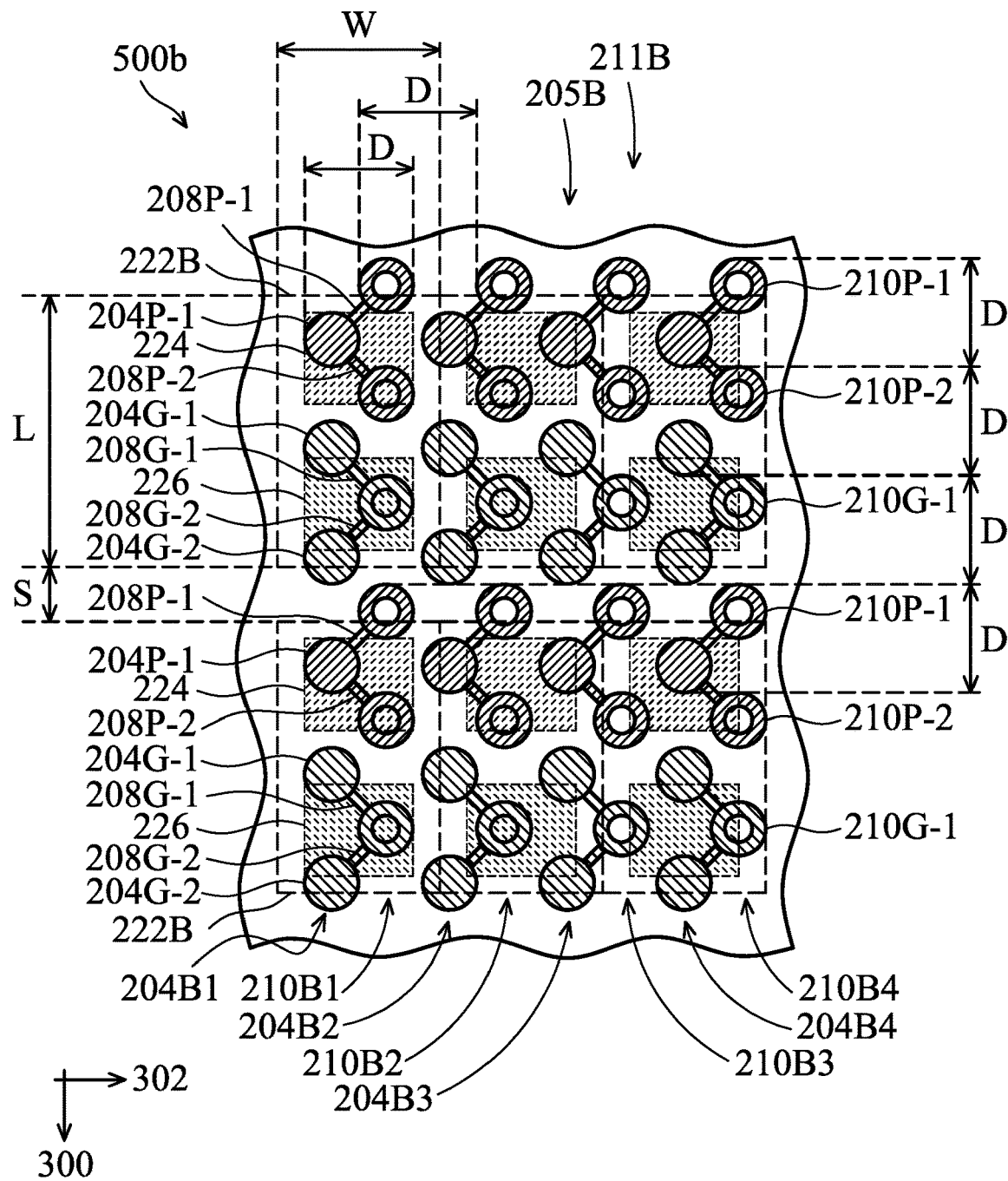

FIG. 3 is a top view of a portion of a first surface 201 of a printed circuit board 500*b* in accordance with some embodiments. If the elements in the figure have a portion that is the same or similar to that shown in FIG. 2, the relevant description provided above can be used as a reference. Therefore, it is not repeated herein. In some embodiments, the pads 204, which are arranged on the substrate-side surface 201 of the body 200 of the printed circuit board 500*b* and electrically connected to the package (ball grid array package structure) 400, are arranged as a pad array 205B. The pad array 205B may be formed by multiple pad column units, which are periodically arranged along the first direction 300 and the second direction 302, for example, the pad column units 204B1, 204B2, 204B3 and 204B4 shown in FIG. 3. In some embodiments, the pad column units of the printed circuit board 500*b* include a plurality of pads arranged in a row along the first direction 300. For example, as shown in FIG. 3, each of the pad column units 204B1, 204B2, 204B3 and 204B4 of the pad array 205B is composed of three pads arranged in a row along the first direction 300. The three pads respectively are pads 204P-1, 204G-1 and 204G-2 sequentially arranged along the first direction 300. The pad 204P-1 is adjacent to the pad 204G-1, the pad 204G-1 is adjacent to the pad 204G-2, and the pad 204G-1 is between the pads 204P-1 and 204G-2 along the first direction 300. In addition, the pads 204P-1, 204G-1 and 204G-2 of each of the pad column units 204B1, 204B2, 204B3 and 204B4 are arranged with a pitch D. Furthermore, for clarity of illustration, the pad array 205B shown in FIG. 3 is illustrated as two pad column units (i.e. the upper pad column unit 204B1 and the lower pad column unit 204B1) periodically arranged along the first direction 300, and four pad column units (i.e. the pad column units 204B1, 204B2, 204B3 and 204B4) periodically arranged along the second direction 302 as an example, but not limited herein. In some other embodiments, the numbers of rows and columns of the pad column units of the pad array 205B may also be changed as required.

In some embodiments, the pad 204P-1 of each of the pad column units 204B1, 204B2, 204B3 and 204B4 is configured to transmit power signals, and the adjacent pads 204G-1 and 204G-2 are configured to transmit ground signals. The type of signal transmitted by the three pads of the other pad column units is analogous to the above-mentioned relationship.

In some embodiments, the pad column units of the printed circuit board 500*b* can be periodically repeatedly arranged along the first direction 300. For example, the pad column units 204B1, 204B2, 204B3 or 204B4 can be periodically repeatedly arranged in a row along the first direction 300. In some embodiments, the adjacent pads disposed in different pad column units along the first direction 300 are arranged with the pitch D. For example, the pad 204G-2 of the pad column unit 204B1 (the upper pad column unit 204B1 in the figure) and the pad 204P-1 of the pad column unit 204B1 (the lower pad column unit 204B1 in the figure) are adjacent to each other and arranged with the pitch D.

In some embodiments, the pads, which are disposed in the different pad column units along the first direction 300 and adjacent to each other, are configured to transmit power signals and configured to transmit ground signals, respectively. For example, the pad 204G-2 disposed in the upper pad column unit 204B1 in the figure is configured to transmit ground signals, and the pad 204P-1 disposed in the lower pad column unit 204B1 in the figure is configured to transmit power signals. The type of signal transmitted by the two adjacent pads disposed in the different pad column units that are adjacent to each other in the first direction 300 is analogous to the above-mentioned relationship.

In some embodiments, the pad column units of the printed circuit board 500*b* can be periodically repeatedly arranged along the second direction 302. For example, as shown in FIG. 3, the pad column unit 204B1 is adjacent to the pad column unit 204B2 along the second direction 302. The pad column unit 204B2 is adjacent to the pad column unit 204B3 along the second direction 302. In addition, the pad column unit 204B3 is adjacent to the pad column unit 204B4 along the second direction 302. In some embodiments, the adjacent pads disposed in the different pad column units along the second direction 302 are arranged with the pitch D. For example, the pad 204P-1 of the pad column unit 204B1 and the pad 204P-1 of the pad column unit 204B2 are adjacent to each other and arranged with the pitch D.

In some embodiments, the adjacent pads, which are disposed in the different pad column units along the second direction 302, are all configured to transmit power signals or configured to transmit ground signals. For example, as shown in FIG. 3, the pad 204P-1 of the pad column unit 204B1 is adjacent to the pad 204P-1 of the pad column unit 204B2 along the second direction 302, and the pad 204P-1 of the pad column unit 204B1 and the pad 204P-1 of the pad column unit 204B2 are both configured to transmit power signals. The pad 204G-1 of the pad column unit 204B1 is adjacent to the pad 204G-1 of the pad column unit 204B2 along the second direction 302, and the pad 204G-1 of the pad column unit 204B1 and the pad 204G-1 of the pad column unit 204B2 are both configured to transmit ground signals. The pad 204G-2 of the pad column unit 204B1 is adjacent to the pad 204G-2 of the pad column unit 204B2 along the second direction 302, and the pad 204G-2 of the pad column unit 204B1 and the pad 204G-2 of the pad column unit 204B2 are both configured to transmit ground signals. The type of signal transmitted by the two adjacent pads disposed in the different pad column units along the second direction 302 is analogous to the above-mentioned relationship.

In some embodiments, the via holes arranged on the substrate-side surface 201 of the body 200 of the printed circuit board 500b and electrically connected to the pads 204 are arranged as a via hole array 211B. The via hole array 211B can be formed by multiple via hole column units, which are periodically arranged along the first direction 300 and the second direction 302, for example, the via hole column units 210B1, 210B2, 210B3 and 210B4 shown in FIG. 3. In some embodiments, the via hole column units 210B1, 210B2, 210B3 and 210B4 are respectively separated from the pad column units 204B1, 204B2, 204B3 and 204B4 by a fixed distance. In some embodiments, the via hole column units of the printed circuit board 500b include a plurality of via holes arranged in a row along the first direction 300. For example, as shown in FIG. 3, each of the via hole column units 210B1, 210B2, 210B3 and 210B4 of the via hole array 211B is composed of three via holes arranged in a row along the first direction 300. The three via holes respectively are via holes 210P-1, 210P-2 and 210G-1 sequentially arranged along the first direction 300. The via hole 210P-1 is adjacent to the via hole 210P-2, the via hole 210P-2 is adjacent to the via hole 210G-1, and the via hole 210P-2 is between the via holes 210P-1 and 210G-1. The via holes 210P-1, 210P-2, and 210G-1 of each of the via hole column units 210B1, 210B2, 210B3 and 210B4 are arranged with the pitch D, In addition, for clarity of illustration, the via hole array 211B shown in FIG. 3 is illustrated as two via hole column units (i.e. the upper via hole column unit 210B1 and the lower via hole column unit 210B1) periodically arranged along the first direction 300, and four via hole column units (i.e. the via hole column units 210B1, 210B2, 210B3 and 210B4) periodically arranged along the second direction 302 as an example, but not limited herein. In some other embodiments, the numbers of rows and columns of the via hole column units of the via hole array 211B may also be changed as required.

In some embodiments, the via hole column units of the printed circuit board 500b can be periodically repeatedly arranged along the first direction 300. For example, the via hole column units 210B1, 210B2, 210B3 and 210B4 can be periodically repeatedly arranged in a row along the first direction 300. In some embodiments, the adjacent via holes disposed in different via hole column units along the first direction 300 are arranged with the pitch D. For example, the via hole 210G-1 of the via hole column unit 210B1 (the upper via hole column unit 210B1 in the figure) and the via hole 210P-1 of the via hole column unit 210B1 (the lower via hole column unit 210B1 in the figure) are adjacent to each other and arranged with the pitch D.

In some embodiments, the via hole column units of the printed circuit board 500b can be periodically repeatedly arranged along the second direction 302. For example, as shown in FIG. 3, the via hole column unit 210B1 is adjacent to the via hole column unit 210B2 along the second direction 302. The via hole column unit 210B2 is adjacent to the via hole column unit 210B3 along the second direction 302. In addition, the via hole column unit 210B3 is adjacent to the via hole column unit 210B4 along the second direction 302. In some embodiments, the adjacent via holes disposed in the different via hole column units along the second direction 302 are arranged with the pitch D. For example, the via hole 210P-1 of the via hole column unit 210B1 and the via hole 210P-1 of the pad column unit 210B2 are adjacent to each other and arranged with the pitch D.

In some embodiments, the pads disposed in the pad column units are arranged in a staggered arrangement with the corresponding via holes disposed in the via hole column units along the first direction 300. For example, the pads 204P-1, 204G-1 and 204G-2 of the pad column unit 204B1 and the via holes 210P-1, 210P-2 and 210G-1 of the via hole column unit 210B1 shown in FIG. 3 are arranged in a staggered arrangement along the first direction 300. In addition, as viewed along the first direction 300, the first pad 204P-1 of the pad column unit 204B1 is disposed between the first via hole 210P-1 and the second via hole 210P-2 of the via hole column unit 210B1. The relationship of the positions between the pads of the other pad column units and the via holes of the corresponding via hole column units is analogous to the above-mentioned relationship.

In some embodiments, each of the pads of the pad column units is separated from the corresponding via hole of the corresponding via hole column units by a fixed distance along the first direction 300 and along the second direction 302, respectively. For example, the pads 204P-1 of the pad column units 204B1 shown in FIG. 3 are separated from the via holes 210P-1 of the via hole column units 210B1 by half of the pitch D along the first direction 300 and half of the pitch D along the second direction 302, respectively. The relationship of the positions between the pads of the other pad column units and the via holes of the corresponding via hole column units is analogous to the above-mentioned relationship.

As shown in FIG. 3, in some embodiments, each of the pads of the pad column units is electrically connected to the via holes of the corresponding via hole column units through the conductive plane layer patterns. In addition, the pads of the pad column units configured to transmit power signals have a one-to-two connection to the via holes of the corresponding via hole column units. The pads of the pad column units configured to transmit ground signals have a two-to-one connection to the via holes of the corresponding via hole column units. For example, the pad 204P-1 of the pad column units 204B1 is electrically connected to the two via holes 210P-1 and 210P-2 of the via hole column unit 210B1 through two conductive plane layer patterns 208P-1 and 208P-2. The pads 204G-1 and 204G-2 of the pad column units 204B1 are electrically connected to the same via hole 210G-1 of the via hole column unit 210B1 through two conductive plane layer patterns 208G-1 and 208G-2, respectively. The relationship of the electrical connections between the pads of the other pad column units and the via holes of the corresponding via hole column units is analogous to the above-mentioned relationship.

In some embodiments, the via holes 210P-1 and 210P-2 of each of the via hole column units 210B1, 210B2, 210B3 and 210B4 are configured to transmit power signals, and the via hole 210G-1 is configured to transmit ground signals due to the relationship of the electrical connections between the pads of the pad column units and the via holes of the corresponding via hole column units. The type of signals transmitted by the other two adjacent via holes of the via hole column units is analogous to the above-mentioned relationship.

In some embodiments, the adjacent via holes disposed in different via hole column units that are adjacent to each other in the first direction 300 are configured to transmit power signals and ground signals, respectively. For example, as shown in FIG. 3, the via hole 210G-1 disposed in the upper via hole column unit 210B1 is configured to transmit ground signals, and the via hole 210P-1 disposed in the lower via hole column unit 210B1 is configured to transmit power signals. The type of signals transmitted by the two adjacent via holes disposed in the different via hole column units that are adjacent to each other in the first direction 300 is analogous to the above-mentioned relationship.

In some embodiments, the adjacent via holes disposed in different via hole column units along the second direction 302 are all configured to transmit power signals or configured to transmit ground signals. For example, as shown in FIG. 3, the via hole 210P-1 of the via hole column unit 210B1 is adjacent to the via hole 210P-1 of the via hole column unit 210B2 along the second direction 302, and the via hole 210P-1 of the via hole column unit 210B1 and the via hole 210P-1 of the via hole column unit 210B2 are both configured to transmit power signals. The via hole 210P-2 of the via hole column unit 210B1 is adjacent to the via hole 210P-2 of the via hole column unit 210B2 along the second direction 302, and the via hole 210P-2 of the via hole column unit 210B1 and the via hole 210P-2 of the via hole column unit 210B2 are both configured to transmit power signals. The via hole 210G-1 of the via hole column unit 210B1 is adjacent to the via hole 210G-1 of the via hole column unit 210B2 along the second direction 302, and the via hole 210G-1 of the via hole column unit 210B1 and the via hole 210G-1 of the via hole column unit 210B2 are both configured to transmit ground signals. The type of signals transmitted by the two adjacent via holes disposed in the different via hole column units along the second direction 302 is analogous to the above-mentioned relationship.

FIG. 3 illustrates the relationship of the positions between the via holes 210P-1, 210P-2 and 210G-1 of each of the via hole column units 210B1, 210B2, 210B3 and 210B4, which are formed passing through the printed circuit board 500b, and a capacitor 222B, which is bonded to the solder bump-side surface 203 of the printed circuit board 500b and electrically connected to the corresponding via holes. As shown in FIG. 3, in some embodiments, each of the via hole column units 210B1, 210B2, 210B3 and 210B4 is electrically connected to the capacitor 222B. Therefore, the capacitor 222B can be periodically arranged corresponding to the numbers of rows and columns of the via hole column units. In addition, the capacitor 222B has a length L along the first direction 300 and a width W along the second direction 302. The length L of the capacitor 222B may be greater than or equal to twice of the pitch D between the pads on the substrate-side surface 201. In addition, the length L of the capacitor 222B may be less than three times of the pitch D. The width W of the capacitor 222B may be greater than or equal to the pitch D between the pads on the substrate-side surface 201. In addition, the width W of the capacitor 222B may be less than twice of the pitch D. For example, the size of the capacitor 222B can completely cover the 3 (column)×2 (row) pads disposed on the substrate-side surface 201.

In some embodiments, the capacitor 222B has a first electrode 224 and a second electrode 226. In the embodiments shown in FIG. 3, the first electrode 224 and the second electrode 226 of the capacitor 222B cover and are electrically connected to the via holes 210P-2 and 210G-1 of the via hole column unit 210B1, respectively. In other words, the first electrode 224 of the capacitor 222B overlaps and is electrically connected to the via hole 210P-2 configured to transmit power signals, and the second electrode 226 of the capacitor 222B overlaps and is electrically connected to the via hole 210G-1 configured to transmit ground signals. Therefore, the via holes 210P-2 and 210G-1 of the via hole column unit 210B1, which are respectively electrically connected to the first electrode 224 and the second electrode 226 of the capacitor 222B, are disposed within a boundary of the capacitor 222B.

It should be noted that in the embodiments shown in FIG. 3, the first via hole 210P-1, which is configured to transmit power signals arranged in the via hole column unit 210B1 along the first direction 300, may not overlap the first electrode 224 and the second electrode 226 of the capacitor 222B. Therefore, the capacitors 222B, which are electrically connected to the different via hole column units 210B1 adjacent to each other in the first direction 300, are separated from each other by a distance S. In some embodiments, the distance S may be greater than or equal to half of the pitch D between the pads on the substrate-side surface 201. Also, the distance S may be less than the pitch D. In addition, as shown in FIG. 3, the second electrode 226 of the capacitor 222B, which is electrically connected to the upper via hole column unit 210B1, is adjacent to the first electrode 224 of the capacitor 222B, which is electrically connected to the lower via hole column unit 210B1. The relationship of the electrical connections between the via holes in the different via hole column units that are adjacent to each other in the first direction 300 and the first electrode and the second electrode of the corresponding capacitors is analogous to the above-mentioned relationship.

In some embodiments, the capacitor 222B electrically connected to the via hole column unit 210B2 and the capacitor 222B electrically connected to the via hole column unit 210B1 have the same arrangement. For example, the first electrode 224 and the second electrode 226 of the capacitor 222B, which are electrically connected to the via hole column unit 210B2, cover and are electrically connected to the via holes 210P-2 and 210G-1 of the via hole column unit 210B2, respectively. In addition, the adjacent capacitors along the second direction 302 can be continuously arranged and do not need to be separated from each other. For example, the capacitor 222B electrically connected to the via hole column unit 210B2 and the capacitor 222B electrically connected to the via hole column unit 210B1 can be continuously arranged and connected to each other. The relationship of the electrical connections between the via holes of the different via hole column units arranged along the second direction 302 and the first electrode and the second electrode of the corresponding capacitors is analogous to the above-mentioned relationship. Also, the distance between two capacitors is analogous to the above-mentioned relationship.

Figure 4:
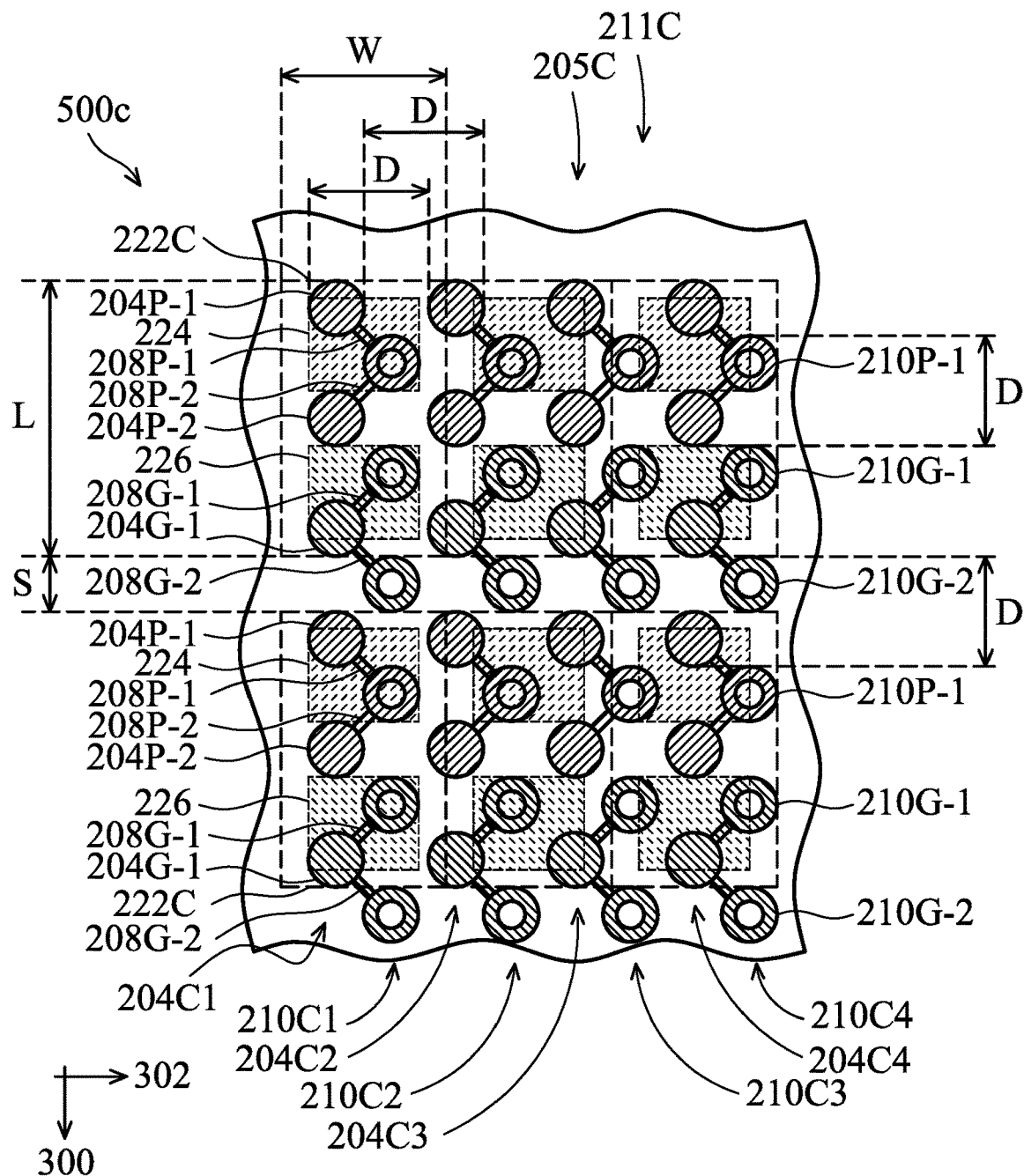

FIG. 4 is a top view of a portion of a first surface 201 of a printed circuit board 500c in accordance with some embodiments. If the elements in the figure have a portion that is the same or similar to that shown in FIGS. 2-3, the relevant description provided above can be used as a reference. Therefore, it is not repeated herein. In some embodiments, the pads 204 arranged on the substrate-side surface 201 of the body 200 of the printed circuit board 500c and electrically connected to the package (ball grid array package structure) 400 are arranged as a pad array 205C. The pad array 205C may be formed by multiple pad column units periodically arranged along the first direction 300 and the second direction 302, for example, the pad column units 204C1, 204C2, 204C3 and 204C4 shown in FIG. 4. In some embodiments, the pad column units of the printed circuit board 500c include a plurality of pads arranged in a row along the first direction 300. For example, as shown in FIG. 4, each of the pad column units 204C1, 204C2, 204C3 and 204C4 of the pad array 205C is composed of three pads arranged in a row along the first direction 300. The three pads respectively are pads 204P-1, 204P-2 and 204G-1 sequentially arranged along the first direction 300. The pad 204P-1 is adjacent to the pad 204P-2, the pad 204P-2 is adjacent to the pad 204G-1, and the pad 204P-2 is between the pads 204P-1 and 204G-1 along the first direction 300. In addition, the pads 204P-1, 204P-2 and 204G-1 of each of the pad column units 204C1, 204C2, 204C3 and 204C4 are arranged with the pitch D. Furthermore, for clarity of illustration, the pad array 205C shown in FIG. 4 is illustrated as two pad column units (i.e. the upper pad column unit 204C1 and the lower pad column unit 204C1) periodically arranged along the first direction 300, and four pad column units (i.e. the pad column units 204C1, 204C2, 204C3 and 204C4) periodically arranged along the second direction 302 as an example, but not limited herein. In some other embodiments, the numbers of rows and columns of the pad column units of the pad array 205C may also be changed as required.

In some embodiments, the pads 204P-1 and 204P-2 of each of the pad column units 204C1, 204C2, 204C3 and 204C4 are configured to transmit power signals, and the pad 204G-1 is configured to transmit ground signals. The type of signal transmitted by the three pads of the other pad column units is analogous to the above-mentioned relationship.

In some embodiments, the pad column units of the printed circuit board 500c can be periodically repeatedly arranged along the first direction 300. For example, the pad column units 204C1, 204C2, 204C3 or 204C4 can be periodically repeatedly arranged in a row along the first direction 300. In some embodiments, the adjacent pads disposed in different pad column units along the first direction 300 are arranged with the pitch D. For example, the pad 204G-1 of the pad column unit 204C1 (the upper pad column unit 204C1 in the figure) and the pad 204P-1 of the pad column unit 204C1 (the lower pad column unit 204C1 in the figure) are adjacent to each other and arranged with the pitch D.

In some embodiments, the adjacent pads, which are disposed in the different pad column units along the first direction 300, are configured to transmit power signals and ground signals, respectively. For example, the pad 204G-1 disposed in the upper pad column unit 204C1 in the figure is configured to transmit ground signals, and the pad 204P-1 disposed in the lower pad column unit 204C1 in the figure is configured to transmit power signals. The type of signal transmitted by the two adjacent pads disposed in the different pad column units that are adjacent to each other in the first direction 300 is analogous to the above-mentioned relationship.

In some embodiments, the pad column units of the printed circuit board 500c can be periodically repeatedly arranged along the second direction 302. For example, as shown in FIG. 4, the pad column unit 204C1 is adjacent to the pad column unit 204C2 along the second direction 302. The pad column unit 204C2 is adjacent to the pad column unit 204C3 along the second direction 302. In addition, the pad column unit 204C3 is adjacent to the pad column unit 204C4 along the second direction 302. In some embodiments, the adjacent pads disposed in the different pad column units along the second direction 302 are arranged with the pitch D. For example, the pad 204P-1 of the pad column unit 204C1 and the pad 204P-1 of the pad column unit 204C2 are adjacent to each other and arranged with the pitch D.

In some embodiments, the adjacent pads disposed in the different pad column units along the second direction 302 are all configured to transmit power signals or configured to transmit ground signals. For example, as shown in FIG. 4, the pad 204P-1 of the pad column unit 204C1 is adjacent to the pad 204P-1 of the pad column unit 204C2 along the second direction 302, and the pad 204P-1 of the pad column unit 204C1 and the pad 204P-1 of the pad column unit 204C2 are both configured to transmit power signals. The pad 204P-2 of the pad column unit 204C1 is adjacent to the pad 204P-2 of the pad column unit 204C2 along the second direction 302, and the pad 204P-2 of the pad column unit 204C1 and the pad 204P-2 of the pad column unit 204C2 are both configured to transmit power signals. The pad 204G-1 of the pad column unit 204C1 is adjacent to the pad 204G-1 of the pad column unit 204C2 along the second direction 302, and the pad 204G-1 of the pad column unit 204C1 and the pad 204G-1 of the pad column unit 204C2 are both configured to transmit ground signals. The type of signal transmitted by the two adjacent pads disposed in the different pad column units along the second direction 302 is analogous to the above-mentioned relationship.

In some embodiments, the via holes, which are arranged on the substrate-side surface 201 of the body 200 of the printed circuit board 500c and electrically connected to the pads 204, are arranged as a via hole array 211C. The via hole array 211C can be formed by multiple via hole column units, which are periodically arranged along the first direction 300 and the second direction 302, for example, the via hole column units 210C1, 210C2, 210C3 and 210C4 as shown in FIG. 4. In some embodiments, the via hole column units 210C1, 210C2, 210C3 and 210C4 are respectively separated from the pad column units 204C1, 204C2, 204C3 and 204C4 by a fixed distance. In some embodiments, the via hole column units of the printed circuit board 500c include a plurality of via holes arranged in a row along the first direction 300. For example, as shown in FIG. 4, each of the via hole column units 210C1, 210C2, 210C3 and 210C4 of the via hole array 211C is composed of three via holes arranged in a row along the first direction 300. The three via holes respectively are via holes 210P-1, 210G-1 and 210G-2 sequentially arranged along the first direction 300. The via hole 210P-1 is adjacent to the via hole 210G-1, the via hole 210G-1 is adjacent to the via hole 210G-2, and the via hole 210G-1 is between the via holes 210P-1 and 210G-2 along the first direction 300. The via holes 210P-1, 210G-1, and 210G-2 of each of the via hole column units 210C1, 210C2, 210C3 and 210C4 are arranged with the pitch D. In addition, for clarity of illustration, the via hole array 211C shown in FIG. 4 is illustrated as two via hole column units (i.e. the upper via hole column unit 210C1 and the lower via hole column unit 210C1) periodically arranged along the first direction 300, and four via hole column units (i.e. the via hole column units 210C1, 210C2, 210C3 and 210C4) periodically arranged along the second direction 302 as an example, but not limited herein. In some other embodiments, the numbers of rows and columns of the via hole column units of the via hole array 211C may also be changed as required.

In some embodiments, the via hole column units of the printed circuit board 500c can be periodically repeatedly arranged along the first direction 300. For example, the via hole column units 210C1, 210C2, 210C3 and 210C4 can be periodically repeatedly arranged in a row along the first direction 300. In some embodiments, the adjacent via holes disposed in different via hole column units along the first direction 300 are arranged with the pitch D. For example, the via hole 210G-2 of the via hole column unit 210C1 (the upper via hole column unit 210C1 in the figure) and the via hole 210P-1 of the via hole column unit 210C1 (the lower via hole column unit 210C1 in the figure) are adjacent to each other and arranged with the pitch D.

In some embodiments, the via hole column units of the printed circuit board 500c can be periodically repeatedly arranged along the second direction 302. For example, as shown in FIG. 4, the via hole column unit 210C1 is adjacent to the via hole column unit 210C2 along the second direction 302. The via hole column unit 210C2 is adjacent to the via hole column unit 210C3 along the second direction 302. In addition, the via hole column unit 210C3 is adjacent to the via hole column unit 210C4 along the second direction 302. In some embodiments, the adjacent via holes disposed in the different via hole column units along the second direction 302 are arranged with the pitch D. For example, the via hole 210P-1 of the via hole column unit 210C1 and the via hole 210P-1 of the pad column unit 210C2 are adjacent to each other and arranged with the pitch D.

In some embodiments, the pads disposed in the pad column units are arranged in a staggered arrangement with the corresponding via holes disposed in the via hole column units along the first direction 300. For example, the pads 204P-1, 204P-2 and 204G-1 of the pad column unit 204C1 shown in FIG. 4 and the via holes 210P-1, 210G-1 and 210G-2 of the via hole column unit 210C1 are arranged in a staggered arrangement along the first direction 300. In addition, as viewed along the first direction 300, the first via hole 210P-1 of the via hole column unit 210C1 is disposed between the first pad 204P-1 and the second pad 204P-2 of the pad column unit 204C1. The relationship of the positions between the pads of the other pad column units and the via holes of the corresponding via hole column units is analogous to the above-mentioned relationship.

In some embodiments, each of the pads of the pad column units is separated from the corresponding via hole of the corresponding via hole column units by a fixed distance along the first direction 300 and along the second direction 302, respectively. For example, the pads 204P-1 of the pad column units 204C1 shown in FIG. 4 are separated from the via holes 210P-1 of the via hole column units 210C1 by half of the pitch D along the first direction 300 and half of the pitch D along the second direction 302, respectively. The relationship of the positions between the pads of the other pad column units and the via holes of the corresponding via hole column units is analogous to the above-mentioned relationship.

As shown in FIG. 4, in some embodiments, each of the pads of the pad column units is electrically connected to the via holes of the corresponding via hole column units through the conductive plane layer patterns. In addition, the pads of the pad column units configured to transmit power signals have a two-to-one connection to the via holes of the corresponding via hole column units, and the pads of the pad column units configured to transmit ground signals have a one-to-two connection to the via holes of the corresponding via hole column units. For example, the pads 204P-1 and 204P-2 of the pad column units 204C1 are electrically connected to the same via hole 210P-1 of the via hole column unit 210C1 through two conductive plane layer patterns 208P-1 and 208P-2, respectively. The pad 204G-1 of the pad column units 204C1 is electrically connected to the two via holes 210G-1 and 204G-2 of the via hole column unit 210C1 through two conductive plane layer patterns 208G-1 and 208G-2. The relationship of the electrical connections between the pads of the other pad column units and the via holes of the corresponding via hole column units is analogous to the above-mentioned relationship.

In some embodiments, the via hole 210P-1 of each of the via hole column units 210C1, 210C2, 210C3 and 210C4 is configured to transmit power signals, and the via holes 210G-1 and 210G-2 are configured to transmit ground signals due to the relationship of the electrical connections between the pads of the pad column units and the via holes of the corresponding via hole column units. The type of signals transmitted by the other two adjacent via holes of the via hole column units is analogous to the above-mentioned relationship.

In some embodiments, the adjacent via holes disposed in different via hole column units that are adjacent to each other in the first direction 300 are configured to transmit power signals and ground signals. For example, as shown in FIG. 4, the via hole 210G-2 disposed in the upper via hole column unit 210C1 is configured to transmit ground signals, and the via hole 210P-1 disposed in the lower via hole column unit 210C1 is configured to transmit power signals. The type of signals transmitted by the two adjacent via holes disposed in the different via hole column units that are adjacent to each other in the first direction 300 is analogous to the above-mentioned relationship.

In some embodiments, the adjacent via holes disposed in different via hole column units along the second direction 302 are all configured to transmit power signals or configured to transmit ground signals. For example, as shown in FIG. 4, the via hole 210P-1 of the via hole column unit 210C1 is adjacent to the via hole 210P-1 of the via hole column unit 210C2 along the second direction 302, and the via hole 210P-1 of the via hole column unit 210C1 and the via hole 210P-1 of the via hole column unit 210C2 are both configured to transmit power signals. The via hole 210G-1 of the via hole column unit 210C1 is adjacent to the via hole 210G-1 of the via hole column unit 210C2 along the second direction 302, and the via hole 210G-1 of the via hole column unit 210C1 and the via hole 210G-1 of the via hole column unit 210C2 are both configured to transmit ground signals. The via hole 210G-2 of the via hole column unit 210C1 is adjacent to the via hole 210G-2 of the via hole column unit 210C2 along the second direction 302, and the via hole 210G-2 of the via hole column unit 210C1 and the via hole 210G-2 of the via hole column unit 210C2 are both configured to transmit ground signals. The type of signals transmitted by the two adjacent via holes disposed in the different via hole column units that are adjacent in the second direction 302 is analogous to the above-mentioned relationship.

FIG. 4 illustrates the relationship of the positions between the via holes 210P-1, 210G-1 and 210G-2 of each of the via hole column units 210C1, 210C2, 210C3 and 210C4, which are formed passing through the printed circuit board 500c, and a capacitor 222C, which is bonded to the solder bump-side surface 203 of the printed circuit board 500c and electrically connected to the corresponding via holes. As shown in FIG. 4, in some embodiments, each of the via hole column units 210C1, 210C2, 210C3 and 210C4 is electrically connected to the capacitor 222C. Therefore, the capacitor 222C can be periodically arranged corresponding to the numbers of rows and columns of the via hole column units. In addition, the capacitor 222C has a length L along the first direction 300 and a width W along the second direction 302. The length L of the capacitor 222C may be greater than or equal to twice of the pitch D between the pads on the substrate-side surface 201. In addition, the length L of the capacitor 222C may be less than three times of the pitch D. The width W of the capacitor 222C may be greater than or equal to the pitch D between the pads on the substrate-side surface 201. In addition, the width W of the capacitor 222C may be less than twice of the pitch D. For example, the size of the capacitor 222C can completely cover the 3 (column)×2 (row) pads disposed on the substrate-side surface 201.

In some embodiments, the capacitor 222C has a first electrode 224 and a second electrode 226. In the embodiments shown in FIG. 4, the first electrode 224 and the second electrode 226 of the capacitor 222C cover and are electrically connected to the via holes 210P-1 and 210G-1 of the via hole column unit 210C1, respectively. In other words, the first electrode 224 of the capacitor 222C overlaps and is electrically connected to the via hole 210P-1 configured to transmit power signals, and the second electrode 226 of the capacitor 222C overlaps and is electrically connected to the via hole 210G-1 configured to transmit ground signals. Therefore, the via holes 210P-1 and 210G-1 of the via hole column unit 210C1, which are respectively electrically connected to the first electrode 224 and the second electrode 226 of the capacitor 222C, are disposed within a boundary of the capacitor 222C.

It should be noted that in the embodiments shown in FIG. 4, the third via hole 210G-2 configured to transmit ground signals arranged in the via hole column unit 210C1 along the first direction 300 may not overlap the first electrode 224 and the second electrode 226 of the capacitor 222C. Therefore, the capacitors 222C, which are electrically connected to the different via hole column units 210C1 adjacent to each other in the first direction 300, are separated from each other by a distance S. In some embodiments, the distance S may be greater than or equal to half of the pitch D between the pads on the substrate-side surface 201. Also, the distance S may be less than the pitch D. In addition, as shown in FIG. 4, the second electrode 226 of the capacitor 222C, which is electrically connected to the upper via hole column unit 210C1, is adjacent to the first electrode 224 of the capacitor 222C, which is electrically connected to the lower via hole column unit 210C1. The relationship of the electrical connections between the via holes in the different via hole column units that are adjacent to each other in the first direction 300 and the first electrode and the second electrode of the corresponding capacitors is analogous to the above-mentioned relationship.

In some embodiments, the capacitor 222C electrically connected to the via hole column unit 210C2 and the capacitor 222C electrically connected to the via hole column unit 210C1 have the same arrangement. For example, the first electrode 224 and the second electrode 226 of the capacitor 222C, which are electrically connected to the via hole column unit 210C2, cover and are electrically connected to the via holes 210P-1 and 210G-1 of the via hole column unit 210C2, respectively. In addition, the adjacent capacitors along the second direction 302 can be continuously arranged and do not need to be separated from each other. For example, the capacitor 222C electrically connected to the via hole column unit 210C2 and the capacitor 222C electrically connected to the via hole column unit 210C1 can be continuously arranged and connected to each other. The relationship of the electrical connections between the via holes of the different via hole column units arranged along the second direction 302 and the first electrode and the second electrode of the corresponding capacitors is analogous to the above-mentioned relationship. Also, the distance between two capacitors is analogous to the above-mentioned relationship.

Figure 5:
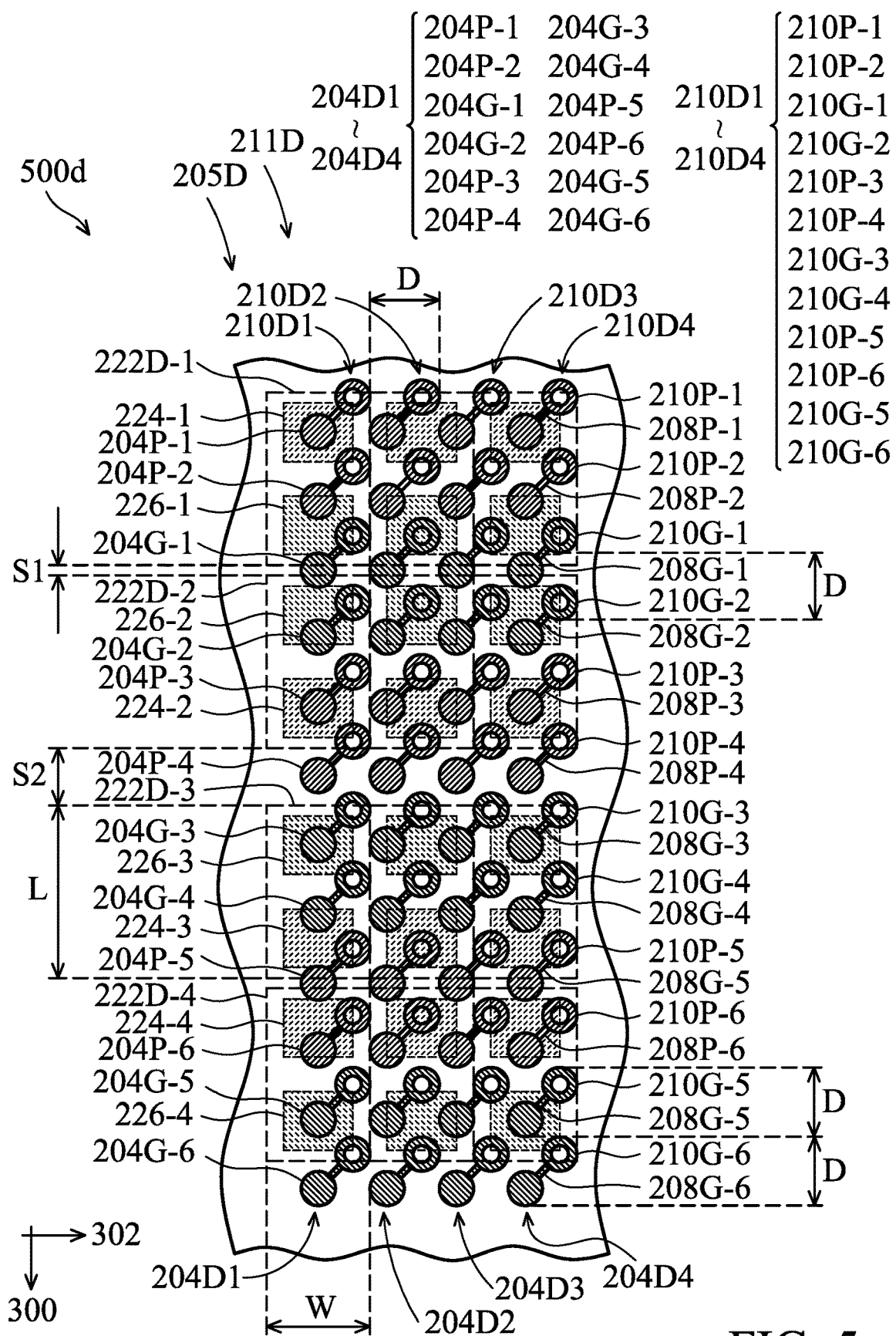

FIG. 5 is a top view of a portion of a first surface 201 of a printed circuit board 500d in accordance with some embodiments. If the elements in the figure have a portion that is the same or similar to that shown in FIGS. 2-3, the relevant description provided above can be used as a reference. Therefore, it is not repeated herein. In some embodiments, the pads 204, which are arranged on the substrate-side surface 201 of the body 200 of the printed circuit board 500d and electrically connected to the package (ball grid array package structure) 400, are arranged as a pad array 205D. The pad array 205D may be formed by multiple pad column units periodically arranged along the first direction 300 and the second direction 302, for example, the pad column units 204D1, 204D2, 204D3 and 204D4 shown in FIG. 5. In some embodiments, the pad column units of the printed circuit board 500d include a plurality of pads arranged in a row along the first direction 300. For example, as shown in FIG. 5, each of the pad column units 204D1, 204D2, 204D3 and 204D4 of the pad array 205D is composed of twelve pads arranged in a row along the first direction 300. The twelve pads respectively are pads 204P-1, 204P-2, 204G-1, 204G-2, 204P-3, 204P-4, 204G-3, 204G-4, 204P-5, 204P-6, 204G-5 and 204G-6 sequentially arranged along the first direction 300. In addition, the pads 204P-1, 204P-2, 204G-1, 204G-2, 204P-3, 204P-4, 204G-3, 204G-4, 204P-5, 204P-6, 204G-5 and 204G-6 of each of the pad column units 204D1, 204D2, 204D3 and 204D4 are arranged with the pitch D. Furthermore, for clarity of illustration, the pad array 205D shown in FIG. 5 is illustrated as one pad column unit 204D1 arranged along the first direction 300, and four pad column units (i.e. the pad column units 204D1, 204D2, 204D3 and 204D4) periodically arranged along the second direction 302 as an example, but not limited herein. In some other embodiments, the numbers of rows and columns of the pad column units of the pad array 205D may also be changed as required.

In some embodiments, the pads 204P-1 to 204P-6 of each of the pad column units 204D1, 204D2, 204D3 and 204D4 are configured to transmit power signals, the pads 204G-1 to 204G-6 of each of the pad column units 204D1, 204D2, 204D3 and 204D4 are configured to transmit ground signals. For example, as viewed from the first direction 300, the first pad 204P-1, the second pad 204P-2, the fifth pad 204P-3, the sixth pad 204P-4, the ninth pad 204P-5 and the tenth pad 204P-6 disposed in each of the pad column units 204D1, 204D2, 204D3 and 204D4 are configured to transmit power signals. The third pad 204G-1, the fourth pad 204G-2, the seventh pad 204G-3, the eighth pad 204G-4, the eleventh pad 204G-5 and the twelfth pad 204G-6 disposed in each of the pad column units 204D1, 204D2, 204D3 and 204D4 are configured to transmit ground signals In some embodiments, the twelve pads constituting the pad column units 204D1, 204D2, 204D3 and 204D4 can be divided into three pad groups sequentially arranged along the first direction 300, for example, the first pad group, the second pad group and the third pad group. In addition, each of the pad groups includes four pads. For example, the first pad group includes pads 204P-1, 204P-2, 204G-1 and 204G-2. The second pad group includes pads 204P-3, 204P-4, 204G-3 and 204G-4. In addition, the third pad group includes pads 204P-5, 204P-6, 204G-5 and 204G-6. In some embodiments, the first pad and the second pad of each of the pad groups are configured to transmit power signals, and the third pad and the fourth pad are configured to transmit ground signals. For example, the pads 204P-1 and 204P-2 of the first pad group, the pads 204P-3 and 204P-4 of the second pad group, and the pads 204P-5 and 204P-6 of the third pad group are configured to transmit power signals. Furthermore, the pads 204G-1 and 204G-2 of the first pad group, the pads 204G-3 and 204G-4 of the second pad group, and the pads 204G-5 and 204G-6 of the third pad group are configured to transmit ground signals.

In some embodiments, the pad column units of the printed circuit board 500d can be periodically arranged along the first direction 300. For example, the pad column units 204D1, 204D2, 204D3 or 204D4 can be periodically arranged in a row along the first direction 300. For example, in the two pad column units 204D1 arranged in the same row along the first direction 300, the twelfth pad 204G-6 (configured to transmit ground signals) of the first pad column unit 204D1 is adjacent to the first pad 204P-1 (configured to transmit power signals) of the second pad column unit 204D1 (the second pad column unit 204D1 is not shown in FIG. 5). In other words, in the two pad column units 204D1 arranged in the same row along the first direction 300, the fourth pad 204G-6 of the third pad group of the first pad column unit 204D1 is adjacent to the first pad 204P-1 of the first pad group of the second pad column unit 204D1.

In some embodiments, the adjacent pads disposed in different pad column units along the first direction 300 are arranged with the pitch D.

In some embodiments, the pad column units of the printed circuit board 500d can be periodically repeatedly arranged along the second direction 302. For example, as shown in FIG. 5, the pad column unit 204D1 is adjacent to the pad column unit 204D2 along the second direction 302. The pad column unit 204D2 is adjacent to the pad column unit 204D3 along the second direction 302. In addition, the pad column unit 204D3 is adjacent to the pad column unit 204D4 along the second direction 302. In some embodiments, the adjacent pads disposed in the different pad column units along the second direction 302 are arranged with the pitch D. For example, the pad 204P-1 of the pad column unit 204D1 and the pad 204P-1 of the pad column unit 204D2 are adjacent to each other and arranged with the pitch D. In other words, the first pad 204P-1 of the first pad group of the pad column unit 204D1 and the first pad 204P-1 of the first pad group of the pad column unit 204D2 are adjacent to each other and arranged with the pitch D.

In some embodiments, the adjacent pads disposed in the different pad column units along the second direction 302 are all configured to transmit power signals or configured to transmit ground signals. For example, as shown in FIG. 5, the pad 204P-1 of the pad column unit 204D1 is adjacent to the pad 204P-1 of the pad column unit 204D2 along the second direction 302, and the pad 204P-1 of the pad column unit 204D1 and the pad 204P-1 of the pad column unit 204D2 are both configured to transmit power signals. The pad 204G-1 of the pad column unit 204D1 is adjacent to the pad 204G-1 of the pad column unit 204D2 along the second direction 302, and the pad 204G-1 of the pad column unit 204D1 and the pad 204G-1 of the pad column unit 204D2 are both configured to transmit ground signals. The type of signal transmitted by the two adjacent pads disposed in the different pad column units along the second direction 302 is analogous to the above-mentioned relationship.

In some embodiments, the via holes arranged on the substrate-side surface 201 of the body 200 of the printed circuit board 500d and electrically connected to the pads 204 are arranged as a via hole array 211D. The via hole array 211D can be formed by multiple via hole column units periodically arranged along the first direction 300 and the second direction 302, for example, the via hole column units 210D1, 210D2, 210D3 and 210D4 as shown in FIG. 5. In some embodiments, the via hole column units 210D1, 210D2, 210D3 and 210D4 are respectively separated from the pad column units 204D1, 204D2, 204D3 and 204D4 by a fixed distance. In some embodiments, the via hole column units of the printed circuit board 500d include a plurality of via holes arranged in a row along the first direction 300. For example, as shown in FIG. 5, each of the via hole column units 210D1, 210D2, 210D3 and 210D4 of the via hole array 211D is composed of twelve via holes arranged in a row along the first direction 300. The twelve via holes respectively are via holes 210P-1, 210P-2, 210G-1, 210G-2, 210P-3, 210P-4, 210G-3, 210G-4, 210P-5, 210P-6, 210G-5 and 210G-6 arranged sequentially along the first direction 300. The via holes 210P-1, 210P-2, 210G-1, 210G-2, 210P-3, 210P-4, 210G-3, 210G-4, 210P-5, 210P-6, 210G-5 and 210G-6 of each of the via hole column units 210D1, 210D2, 210D3 and 210D4 are arranged with the pitch D. In addition, for clarity of illustration, the via hole array 211D shown in FIG. 5 is illustrated as one via hole column unit 210D1 arranged along the first direction 300, and four via hole column units (i.e. the via hole column units 210D1, 210D2, 210D3 and 210D4) periodically arranged along the second direction 302 as an example, but not limited herein. In some other embodiments, the numbers of rows and columns of the via hole column units of the via hole array 211D may also be changed as required.

In some embodiments, the via holes 210P-1 to 210P-6 of each of the via hole column units 210D1, 210D2, 210D3 and 210D4 are configured to transmit power signals. The via holes 210G-1 to 210G-6 are configured to transmit ground signals. For example, as viewed from the first direction 300, the first via hole 210P-1, the second via hole 210P-2, the fifth via hole 210P-3, the sixth via hole 210P-4, the ninth via hole 210P-5 and the tenth via hole 210P-6 disposed in each of the via hole column units 210D1, 210D2, 210D3 and 210D4 are configured to transmit power signals, and the third via hole 210G-1, the fourth via hole 210G-2, the seventh via hole 210G-3, the eighth via hole 210G-4, the eleventh via hole 210G-5 and the twelfth via hole 210G-6 disposed in each of the via hole column units 210D1, 210D2, 210D3 and 210D4 are configured to transmit ground signals.

In some embodiments, the twelve via holes constituting the via hole column units 210D1, 210D2, 210D3 and 210D4 can be divided into three via hole groups sequentially arranged along the first direction 300, for example, the first via hole group, the second via hole group and the third via hole group. In addition, each of the via hole groups includes four via holes. For example, the first via hole group includes via holes 210P-1, 210P-2, 210G-1 and 210G-2, the second via hole group includes via holes 210P-3, 210P-4, 210G-3 and 210G-4, and the third via hole group includes via holes 210P-5, 210P-6, 210G-5 and 210G-6. In some embodiments, the first via hole and the second via hole of each of the via hole groups are configured to transmit power signals, and the third via hole and the fourth via hole of each of the via hole groups are configured to transmit ground signals.

For example, the via holes 210P-1 and 210P-2 of the first via hole group, the via holes 210P-3 and 210P-4 of the second via hole group, and the via holes 210P-5 and 210P-6 of the third via hole group are configured to transmit power signals. Furthermore, the via holes 210G-1 and 210G-2 of the first via hole group, the via holes 210G-3 and 210G-4 of the second via hole group, and the via holes 210G-5 and 210G-6 of the third via hole group are configured to transmit ground signals.

In some embodiments, the pad column units of the printed circuit board 500d can be periodically arranged along the first direction 300. For example, the via hole column units 210D1, 210D2, 210D3 or 210D4 can be periodically arranged in a row along the first direction 300. For example, in the two via hole column units 210D1 arranged in the same row along the first direction 300, the twelfth via hole 210G-6 (configured to transmit ground signals) of the first via hole column unit 210D1 is adjacent to the first via hole 210P-1 (configured to transmit power signals) of the second pad column unit 210D1. In other words, in the two via hole column units 210D1 arranged in the same row along the first direction 300, the fourth via hole 210G-6 of the third via hole group of the first via hole column unit 210D1 is adjacent to the first via hole 210P-1 of the first via hole group of the second via hole column unit 210D1.

In some embodiments, the adjacent via holes disposed in different via hole column units along the first direction 300 are arranged with the pitch D.

In some embodiments, the via hole column units of the printed circuit board 500d can be periodically repeatedly arranged along the second direction 302. For example, as shown in FIG. 5, the via hole column unit 210D1 is adjacent to the via hole column unit 210D2 along the second direction 302. The via hole column unit 210D2 is adjacent to the via hole column unit 210D3 along the second direction 302. In addition, the via hole column unit 210D3 is adjacent to the via hole column unit 210D4 along the second direction 302. In some embodiments, the adjacent via holes disposed in the different via hole column units along the second direction 302 are arranged with the pitch D. For example, the via hole 210P-1 of the via hole column unit 210D1 and the via hole 210P-1 of the pad column unit 210D2 are adjacent to each other and arranged with the pitch D. In other words, the first via hole 210P-1 of the first via hole group of the via hole column unit 210D1 and the first via hole 210P-1 of the first via hole group of the via hole column unit 210D2 are adjacent to each other and arranged with the pitch D.

In some embodiments, the pads disposed in the pad column units are arranged in a staggered arrangement with the corresponding via holes disposed in the via hole column units along the first direction 300. For example, the twelve pads 204P-1, 204P-2, 204G-1, 204G-2, 204P-3, 204P-4, 204G-3, 204G-4, 204P-5, 204P-6, 204G-5 and 204G-6 of the pad column unit 204D1 shown in FIG. 5 and the twelve via holes 210P-1, 210P-2, 210G-1, 210G-2, 210P-3, 210P-4, 210G-3, 210G-4, 210P-5, 210P-6, 210G-5 and 210G-6 of the via hole column unit 210D1 are arranged in a staggered arrangement along the first direction 300. In other words, the first pad to the fourth pad of each of the pad groups of the pad column unit 204D1 and the first via hole to the fourth via hole of the corresponding via hole groups are arranged in a staggered arrangement along the first direction 300. For example, the first pad to the fourth pad (the pads 204P-1, 204P-2, 204G-1 and 204G-2) of the first pad group of the pad column unit 204D1 and the first via hole to the fourth via hole (the via holes 210P-1, 210P-2, 210G-1 and 210G-2) of the first via hole group of the via hole column unit 210D1 are arranged in a staggered arrangement along the first direction 300. In addition, as viewed along the first direction 300, the first pad 204P-1 of the pad column unit 204D1 is disposed between the first via hole 210P-1 and the second via hole 210P-2 of the via hole column unit 210D1. The relationship of the positions between the pads of the other pad column units and the via holes of the corresponding via hole column units is analogous to the above-mentioned relationship.

In some embodiments, each of the pads of the pad column units is separated from the corresponding via hole of the corresponding via hole column units by a fixed distance along the first direction 300 and along the second direction 302, respectively. For example, as shown in FIG. 5, the pads 204P-1 of the pad column units 204D1 are separated from the via holes 210P-1 of the via hole column units 210D1 by half of the pitch D along the first direction 300 and half of the pitch D along the second direction 302, respectively. The relationship of the positions between the pads of the other pad column units and the via holes of the corresponding via hole column units is analogous to the above-mentioned relationship.

As shown in FIG. 5, in some embodiments, each of the pads of the pad column units is electrically connected to the via holes of the corresponding via hole column units through the conductive plane layer patterns, and the pads of the pad column units have one-to-one connection to the via holes of the corresponding via hole column units. For example, the twelve pads 204P-1, 204P-2, 204G-1, 204G-2, 204P-3, 204P-4, 204G-3, 204G-4, 204P-5, 204P-6, 204G-5 and 204G-6 of the pad column units 204D1 are electrically connected to the twelve via holes 210P-1, 210P-2, 210G-1, 210G-2, 210P-3, 210P-4, 210G-3, 210G-4, 210P-5, 210P-6, 210G-5 and 210G-6 of the via hole column unit 210D1 through conductive plane layer patterns 208P-1, 208P-2, 208G-1, 208G-2, 208P-3, 208P-4, 208G-3, 208G-4, 208P-5, 208P-6, 208G-5 and 208G-6, respectively. The relationship of the electrical connections between the pads of the other pad column units and the via holes of the corresponding via hole column units is analogous to the above-mentioned relationship.

In some embodiments, the via holes 210P-1 to 210P-6 of each of the via hole column units 210D1, 210D2, 210D3 and 210D4 are configured to transmit power signals, and the via holes 210G-1 to 210G-6 are configured to transmit ground signals due to the relationship of the electrical connections between the pads of the pad column units and the via holes of the corresponding via hole column units. For example, as viewed from the first direction 300, the first via hole 210P-1, the second via hole 210P-2, the fifth via hole 210P-3, the sixth via hole 210P-4, the ninth via hole 210P-5 and the tenth via hole 210P-6 disposed in each of the via hole column units 210D1, 210D2, 210D3 and 210D4 are configured to transmit power signals, and the third via hole 210G-1, the fourth via hole 210G-2, the seventh via hole 210G-3, the eighth via hole 210G-4, the eleventh via hole 210G-5 and the twelfth via hole 210G-6 disposed in each of the via hole column units 210D1, 210D2, 210D3 and 210D4 are configured to transmit ground signals. The type of signals transmitted by the other two adjacent via holes of the via hole column units is analogous to the above-mentioned relationship.

In some embodiments, the adjacent via holes disposed in different via hole column units along the second direction 302 are all configured to transmit power signals or configured to transmit ground signals. For example, as shown in FIG. 5, the via hole 210P-1 of the via hole column unit 210D1 is adjacent to the via hole 210P-1 of the via hole column unit 210D2 along the second direction 302, and the via hole 210P-1 of the via hole column unit 210D1 and the via hole 210P-1 of the via hole column unit 210D2 are both configured to transmit power signals. The via hole 210G-1 of the via hole column unit 210D1 is adjacent to the via hole 210G-1 of the via hole column unit 210D2 along the second direction 302, and the via hole 210G-1 of the via hole column unit 210D1 and the via hole 210G-1 of the via hole column unit 210D2 are both configured to transmit ground signals. The type of signals transmitted by the two adjacent via holes disposed in the different via hole column units that are adjacent in the second direction 302 is analogous to the above-mentioned relationship.

FIG. 5 illustrates the relationship of the positions between the via holes 210P-1 to 210P-6 and 210G-1 to 210G-6 of each of the via hole column units 210D1, 210D2, 210D3 and 210D4, which are formed passing through the printed circuit board 500d, and capacitors 222D-1, 222D-2, 222D-3 and 222D-4, which are bonded to the solder bump-side surface 203 of the printed circuit board 500d and electrically connected to the corresponding via holes. As shown in FIG. 5, in some embodiments, each of the via hole column units 210D1, 210D2, 210D3 and 210D4 is electrically connected to the capacitors 222D-1, 222D-2, 222D-3 and 222D-4 sequentially arranged along the first direction 300. Therefore, the capacitors 222D-1, 222D-2, 222D-3 and 222D-4 can be periodically arranged corresponding to the numbers of rows and columns of the via hole column units. In addition, each of the capacitors 222D-1, 222D-2, 222D-3 and 222D-4 has a length L along the first direction 300 and a width W along the second direction 302. The length L of each of the capacitors 222D-1, 222D-2, 222D-3 and 222D-4 may be greater than or equal to twice of the pitch D between the pads on the substrate-side surface 201. In addition, the length L of each of the capacitors 222D-1, 222D-2, 222D-3 and 222D-4 may be less than three times of the pitch D. The width W of each of the capacitors 222D-1, 222D-2, 222D-3 and 222D-4 may be greater than or equal to the pitch D between the pads on the substrate-side surface 201. In addition, the width W of each of the capacitors 222D-1, 222D-2, 222D-3 and 222D-4 may be less than twice of the pitch D. For example, the size of each of the capacitors 222D-1, 222D-2, 222D-3 and 222D-4 can completely cover the 3 (column)×2 (row) pads disposed on the substrate-side surface 201.

In some embodiments, the capacitor 222D-1 has a first electrode 224-1 and a second electrode 226-1. The capacitor 222D-2 has a first electrode 224-2 and a second electrode 226-2. The capacitor 222D-3 has a first electrode 224-3 and a second electrode 226-3. In addition, the capacitor 222D-4 has a first electrode 224-4 and a second electrode 226-4. In the embodiments shown in FIG. 5, the first electrode 224-1 covers and is electrically connected to the first via hole 210P-1 and the second via hole 210P-2 arranged in the via hole column unit 210D1 along the first direction 300. The second electrode 226-1 covers and is electrically connected to the third via hole 210G-1 of the via hole column unit 210D1. In other words, the first electrode 224-1 of the capacitor 222D-1 overlaps and is electrically connected to the two via holes 210P-1 and 210P-2 configured to transmit power signals. The second electrode 226-1 of the capacitor 222D-1 overlaps and is electrically connected to the one via hole 210G-1 configured to transmit ground signals. Furthermore, the via holes 210P-1, 210P-2 and 210G-1 of the via hole column unit 210D1, which are respectively electrically connected to the first electrode 224-1 and the second electrode 226-1 of the capacitor 222D-1, are disposed within a boundary of the capacitor 222D-1.

In some embodiments, the first electrode 224-1 of the capacitor 222D-1 is in contact with and electrically connected to the first via hole and the second via hole (the via holes 210P-1 and 210P-2) of the first via hole group of the via hole column unit 210D1, and the second electrode 226-1 of the capacitor 222D-1 is in contact with and electrically connected to the third via hole (the via hole 210G-1) of the first via hole group of the via hole column unit 210D1.

Furthermore, in the embodiments shown in FIG. 5, the first electrode 224-2 of the capacitor 222D-2 covers and is electrically connected to the fifth via hole 210P-3 and the sixth via hole 210P-4, which are arranged in the via hole column unit 210D1 along the first direction 300. The second electrode 226-2 covers and is electrically connected to the fourth via hole 210G-2 of the via hole column unit 210D1. In other words, the first electrode 224-2 of the capacitor 222D-2 overlaps and is electrically connected to the two via holes 210P-3 and 210P-4 configured to transmit power signals, and the second electrode 226-2 of the capacitor 222D-2 overlaps and is electrically connected to the via hole 210G-2 configured to transmit ground signals. In addition, the via holes 210P-3, 210P-4 and 210G-2 of the via hole column unit 210D1, which are respectively electrically connected to the first electrode 224-2 and the second electrode 226-2 of the capacitor 222D-2, are disposed within a boundary of the capacitor 222D-2.

In some embodiments, the first electrode 224-2 of the capacitor 222D-2 is in contact with and electrically connected to the first via hole and the second via hole (the via holes 210P-3 and 210P-4) of the second via hole group of the via hole column unit 210D1. The second electrode 226-2 of the capacitor 222D-2 is in contact with and electrically connected to the fourth via hole (the via hole 210G-2) of the first via hole group of the via hole column unit 210D1.

In some embodiments, the third via hole 210G-1, which is configured to transmit ground signals and arranged in the via hole column unit 210D1 along the first direction 300, partially overlaps the second electrode 226-1 of the capacitor 222D-1. The fourth via hole 210G-2, which is configured to transmit ground signals and arranged in the via hole column unit 210D1 along the first direction 300, partially overlaps the second electrode 226-2 of the capacitor 222D-2. Therefore, the second electrode 226-1 of the capacitor 222D-1, which is electrically connected to via hole column unit 210D1, is adjacent to the second electrode 226-2 of the capacitor 222D-2. In some embodiments, the capacitors 222D-1 and 222D-2 are separated from each other by a distance S1. In some embodiments, the distance S1 may be less than half of the pitch D between the pads on the substrate-side surface 201. In some other embodiments, the capacitors 222D-1 and 222D-2 can be continuously arranged and do not need to be separated from each other.

Furthermore, in the embodiments shown in FIG. 5, the first electrode 224-3 of the capacitor 222D-3 covers and is electrically connected to the ninth via hole 210P-5 arranged in the via hole column unit 210D1 along the first direction 300, and the second electrode 226-3 covers and is electrically connected to the seventh via hole 210G-3 and the eighth via hole 210G-4, which are arranged in the via hole column unit 210D1 along the first direction 300. In other words, the first electrode 224-3 of the capacitor 222D-3 overlaps and is electrically connected to the one via hole 210P-5 configured to transmit power signals, and the second electrode 226-3 of the capacitor 222D-3 overlaps and is electrically connected to the two via holes 210G-3 and 210G-4 configured to transmit ground signals. Furthermore, the via holes 210P-5, 210G-3 and 210G-4 of the via hole column unit 210D1, which are respectively electrically connected to the first electrode 224-3 and the second electrode 226-3 of the capacitor 222D-3, are disposed within a boundary of the capacitor 222D-3.

In some embodiments, the first electrode 224-3 of the capacitor 222D-3 is in contact with and electrically connected to the first via hole (the via hole 210P-5) of the third via hole group of the via hole column unit 210D1, and the second electrode 226-3 of the capacitor 222D-3 is in contact with and electrically connected to the third via hole and the fourth via hole (the via holes 210G-3 and 210G-4) of the second via hole group of the via hole column unit 210D1.

Moreover, in the embodiments shown in FIG. 5, the first electrode 224-4 of the capacitor 222D-4 covers and is electrically connected to the tenth via hole 210P-6 arranged in the via hole column unit 210D1 along the first direction 300, and the second electrode 226-4 covers and is electrically connected to the eleventh via hole 210G-5 and the twelfth via hole 210G-6 arranged in the via hole column unit 210D1 along the first direction 300. In other words, the first electrode 224-4 of the capacitor 222D-4 overlaps and is electrically connected to the one via hole 210P-6 configured to transmit power signals, and the second electrode 226-4 of the capacitor 222D-4 overlaps and is electrically connected to the two via holes 210G-5 and 210G-6 configured to transmit ground signals. Furthermore, the via holes 210P-6, 210G-5 and 210G-6 of the via hole column unit 210D1, which are respectively electrically connected to the first electrode 224-4 and the second electrode 226-4 of the capacitor 222D-4, are disposed within a boundary of the capacitor 222D-4.

In some embodiments, the first electrode 224-4 of the capacitor 222D-4 is in contact with and electrically connected to the second via hole (the via hole 210P-6) of the third via hole group of the via hole column unit 210D1, and the second electrode 226-4 of the capacitor 222D-4 is in contact with and electrically connected to the third via hole and the fourth via hole (the via holes 210G-5 and 210G-6) of the third via hole group of the via hole column unit 210D1.

It should be noted that in the embodiments shown in FIG. 5, the sixth via hole 210P-4, which is configured to transmit power signals and arranged in the via hole column unit 210D1 along the first direction 300, partially overlaps and is electrically connected to the first electrode 224-2 of the capacitor 222D-2. The seventh via hole 210G-3, which is configured to transmit ground signals and arranged in the via hole column unit 210D1 along the first direction 300, partially overlaps and is electrically connected to the second electrode 226-3 of the capacitor 222D-3. Therefore, the capacitors 222D-2 and 222D-3, which are electrically connected to the same via hole column unit 210D1, are separated from each other by a distance S2. In some embodiments, the distance S2 may be greater than or equal to half of the pitch D between the pads on the substrate-side surface 201. Also, the distance S2 may be less than the pitch D. In addition, the first electrode 224-2, which is coupled to the via hole 210P-4 configured to transmit power signals in the capacitor 222D-2, is adjacent to the second electrode 226-3, which is coupled to the via hole 210G-3 configured to transmit ground signals in the capacitors 222D-3. The relationship of the electrical connections between the via holes arranged in the same via hole column unit and the first electrode and the second electrode of the corresponding capacitors is analogous to the above-mentioned relationship. Also, the distance between two capacitors is analogous to the above-mentioned relationship.

In some embodiments, the capacitors 222D-1, 222D-2, 222D-3 and 222D-4, which are electrically connected to the via hole column unit 210D2, and the capacitors 222D-1, 222D-2, 222D-3 and 222D-4, which are electrically connected to the via hole column unit 210D1 have the same arrangement. For example, the first electrode 224-1 of the capacitor 222D-1, which is electrically connected to the via hole column unit 210D2, covers and is electrically connected to the first via hole 210P-1 and the second via hole 210P-2, which are arranged in the via hole column unit 210D2 along the first direction 300. The second electrode 226-1 of the capacitor 222D-1, which is electrically connected to the via hole column unit 210D2, covers and is electrically connected to the third via hole 210G-1, which is arranged in the via hole column unit 210D2 along the first direction 300. The first electrode 224-2 of the capacitor 222D-2, which is electrically connected to the via hole column unit 210D2, covers and is electrically connected to the fifth via hole 210P-3 and the sixth via hole 210P-4, which are arranged in the via hole column unit 210D2 along the first direction 300 The second electrode 226-2 of the capacitor 222D-2, which is electrically connected to the via hole column unit 210D2, covers and is electrically connected to the fourth via hole 210G-2, which is arranged in the via hole column unit 210D2 along the first direction 300. The first electrode 224-3 of the capacitor 222D-3, which is electrically connected to the via hole column unit 210D2, covers and is electrically connected to the ninth via hole 210P-5, which is arranged in the via hole column unit 210D2 along the first direction 300. The second electrode 226-3 of the capacitor 222D-3, which is electrically connected to the via hole column unit 210D2, covers and is electrically connected to the seventh via hole 210G-3 and the eighth via hole 210G-4, which are arranged in the via hole column unit 210D2 along the first direction 300. The first electrode 224-4 of the capacitor 222D-4, which is electrically connected to the via hole column unit 210D2, covers and is electrically connected to the tenth via hole 210P-6, which is arranged in the via hole column unit 210D2 along the first direction 300. In addition, the second electrode 226-4 of the capacitor 222D-4, which is electrically connected to the via hole column unit 210D2, covers and is electrically connected to the eleventh via hole 210G-5 and the twelfth via hole 210G-6, which are arranged in the via hole column unit 210D2 along the first direction 300. In addition, the adjacent capacitors along the second direction 302 can be continuously arranged and do not need to be separated from each other. For example, the capacitor 222D-1 electrically connected to the via hole column unit 210D2 and the capacitor 222D-1 electrically connected to the via hole column unit 210D1 can be continuously arranged and connected to each other. The relationship of the electrical connections between the via holes of the different via hole column units arranged along the second direction 302 and the first electrode and the second electrode of the corresponding capacitors is analogous to the above-mentioned relationship. Also, the distance between two capacitors is analogous to the above-mentioned relationship.

The present disclosure provides a printed circuit board and a semiconductor package structure. The printed circuit board, for example, is a printed circuit configured to hold a ball grid array package (BGA structure). The semiconductor package structure, for example, is a ball grid array package (BGA structure). The printed circuit board of the semiconductor package structure has power pads and ground pads electrically connected to the ball grid array package, and corresponding power via holes and ground via holes. In some embodiments, the printed circuit board of the semiconductor package structure has a via hole array including a plurality of via hole column units periodically arranged along a first direction and a second direction. In some embodiments, the via hole column units include six via holes arranged along the first direction passing through a body of the printed circuit board and electrically connected to capacitors, wherein any two adjacent via holes are configured to transmit power signals and ground signals, respectively. In some embodiments, the via hole column units include three via holes arranged along the first direction. As viewed from the first direction, the first via hole is configured to transmit power signals, the third via hole is configured to transmit ground signals, and the second via hole is configured to transmit power signals or configured to transmit ground signals. In some embodiments, the via hole column units include a first via hole group, a second via hole group and a third via hole group sequentially arranged along the first direction. Each of the first via hole group to the third via hole group includes a first via hole, a second via hole, a third via hole and a fourth via hole passing through the body and electrically connected to the capacitors. As viewed from the first direction, the first via hole and the second via hole are configured to transmit power signals, the third via hole and the fourth via hole are configured to transmit ground signals. The printed circuit board of the semiconductor package structure makes the arrangement of the capacitors (for example, decoupling capacitors) bonded to the solder bump-side surface of the printed circuit board tighter using the aforementioned arrangements of the power via holes and the ground via holes. The capacitor density can be increased. In addition, because the printed circuit board of the present disclosure has capacitors arranged tightly, the impedance of the power path is effectively reduced, and the printed circuit board of present disclosure has better power integrity (PI).

While the present disclosure has been described by way of example and in terms of some embodiments, it is not intended to be limited therein. Those skilled in the art may make various changes and modifications to the present disclosure without departing from the spirit and scope of the present disclosure. Therefore, the scope of the present disclosure should be viewed as the definition of the appended claims.

What is claimed is:

1. A printed circuit board, comprising:
   a body, having a first surface and a second surface opposite the first surface, wherein the first surface is configured to bond to a circuit substrate, and the second surface is configured to bond to a capacitor; and
   a via hole array, comprising via hole column units periodically arranged along a first direction, wherein each of the via hole column units comprises via holes passing through the body and electrically connected to the capacitor, and the via holes of each of the via hole column units comprise:
   a first via hole, a second via hole and a third via hole arranged sequentially along the first direction, wherein the first via hole is configured to transmit power signals, the third via hole is configured to transmit ground signals, and the second via hole is configured to transmit the power signals or the ground signals,
   wherein the third via hole of one of the via hole column units is adjacent to the first via hole of another one of the via hole column units, which is adjacent to the one of the via hole column units.

2. The printed circuit board as claimed in claim 1, wherein a portion of the via hole column units of the via hole array are periodically arranged along a second direction that is different from the first direction, and the first via hole of one of the via hole column units is adjacent to the first via hole of yet another one of the via hole column units along the second direction.

3. The printed circuit board as claimed in claim 1, further comprising:
   a pad array disposed on the first surface of the body, wherein the pad array comprises pad column units periodically arranged along the first direction, each of the pad column units comprises pads arranged in a row, and the pads of each of the pad column units comprise:
   a first pad, a second pad and a third pad arranged sequentially along the first direction, wherein the first pad, the second pad and the third pad of one of the pad column units and the first via hole, the second via hole, and the third via hole of one of the via hole column units are arranged in a staggered arrangement along the first direction.

4. The printed circuit board as claimed in claim 3, wherein the first pad of one of the pad column units is electrically connected to the first via hole and the second via hole of one of the via hole column units, and the second pad and the third pad of one of the pad column units are electrically connected to the third via hole of one of the via hole column units.

5. The printed circuit board as claimed in claim 3, wherein the first pad and the second pad of one of the pad column units are electrically connected to the first via hole of one of the via hole column units, and the third pad of one of the pad column units is electrically connected to the second via hole and the third via hole of one of the via hole column units.

6. The printed circuit board as claimed in claim 1, further comprising:
   a first capacitor bonded to the second surface of the printed circuit board, wherein the first capacitor has a first electrode and a second electrode,
   wherein the first electrode overlaps and is electrically connected to the first via hole or the second via hole of one of the via hole column units, wherein the second electrode overlaps and is electrically connected to the second via hole or the third via hole of one of the via hole column units, and wherein the first electrode and the second electrode are electrically connected to the different via holes.

7. The printed circuit board as claimed in claim 6, wherein the second via hole of one of the via hole column units overlaps and is electrically connected to the first electrode or the second electrode of the first capacitor.

8. The printed circuit board as claimed in claim 6, further comprising:
   a second capacitor bonded to the second surface of the printed circuit board, wherein a first electrode of the second capacitor overlaps and is electrically connected to the first via hole or the second via hole of another one of the via hole column units, wherein a second electrode of the second capacitor overlaps and is electrically connected to the second via hole or the third via hole of another one of the via hole column units, and wherein the first electrode and the second electrode of the second capacitor are electrically connected to the different via holes.

9. The printed circuit board as claimed in claim 8, wherein the second via hole of another one of the via hole column units overlaps and is electrically connected to the first electrode or the second electrode of the second capacitor.

10. The printed circuit board as claimed in claim 8, further comprising:
a third capacitor bonded to the second surface of the printed circuit board, wherein a first electrode of the third capacitor overlaps and is electrically connected to the first via hole or the second via hole of one of the via hole column units, wherein a second electrode of the third capacitor overlaps and is electrically connected to the second via hole or the third via hole of one of the via hole column units, and the first electrode and the second electrode of the third capacitor are electrically connected to the different via holes.

11. The printed circuit board as claimed in claim 10, wherein the second via hole of yet another one of the via hole column units overlaps and is electrically connected to the first electrode or the second electrode of the third capacitor.

12. A semiconductor package structure, comprising:
a printed circuit board, comprising:
a body, having a first surface and a second surface opposite each other; and
a via hole array, comprising via hole column units periodically arranged along a first direction, wherein each of the via hole column units comprises via holes passing through the body and electrically connected to the capacitor, and the via holes of each of the via hole column units comprise:
a first via hole, a second via hole and a third via hole arranged sequentially along the first direction, wherein the first via hole is configured to transmit power signals, the third via hole is configured to transmit ground signals, and the second via hole is configured to transmit the power signals or the ground signals,
a package bonded to the first surface of the printed circuit board; and
a first capacitor bonded to the second surface of the printed circuit board, wherein the first capacitor has a first electrode and a second electrode,
wherein the first electrode overlaps and is electrically connected to the first via hole or the second via hole of one of the via hole column units, the second electrode overlaps and is electrically connected to the second via hole or the third via hole of one of the via hole column units, and the first electrode and the second electrode are electrically connected to different via holes.

13. The semiconductor package structure as claimed in claim 12, wherein the package comprises a circuit substrate and a chip, the chip is disposed on a chip-side surface of the circuit substrate, and the printed circuit board is disposed on a solder bump-side surface of the circuit substrate.

14. The semiconductor package structure as claimed in claim 12, wherein the second via hole of one of the via hole column units overlaps and is electrically connected to the first electrode or the second electrode of the first capacitor.

15. The semiconductor package structure as claimed in claim 12, wherein a portion of the via hole column units of the via hole array are periodically arranged along a second direction that is different from the first direction, and the first via hole of one of the via hole column units is adjacent to the first via hole of yet another one of the via hole column units along the second direction.

16. The semiconductor package structure as claimed in claim 12, wherein the first via hole to the third via hole of the via hole column unit electrically connected to the first electrode and the second electrode of the first capacitor are disposed in a boundary of the first capacitor.

17. A semiconductor package structure as claimed in claim 12, further comprising:
a second capacitor bonded to the second surface of the printed circuit board, wherein a first electrode of the second capacitor overlaps and is electrically connected to the first via hole or the second via hole of another one of the via hole column units, a second electrode of the second capacitor overlaps and is electrically connected to the second via hole or the third via hole of another one of the via hole column units, and the first electrode and the second electrode of the second capacitor are electrically connected to the different via holes.

18. The semiconductor package structure as claimed in claim 17, wherein the second via hole of another one of the via hole column units overlaps and is electrically connected to the first electrode or the second electrode of the second capacitor.

19. The semiconductor package structure as claimed in claim 17, further comprising:
a third capacitor bonded to the second surface of the printed circuit board, wherein a first electrode of the third capacitor overlaps and is electrically connected to the first via hole or the second via hole of one of the via hole column units, a second electrode of the third capacitor overlaps and is electrically connected to the second via hole or the third via hole of one of the via hole column units, and the first electrode and the second electrode of the third capacitor are electrically connected to the different via holes.

20. The semiconductor package structure as claimed in claim 19, wherein the second via hole of another one of the via hole column units overlaps and is electrically connected to the first electrode or the second electrode of the third capacitor.

21. The semiconductor package structure as claimed in claim 12, further comprising:
a pad array disposed on the first surface of the body, wherein the pad array comprises pad column units periodically arranged along the first direction, each of the pad column units comprises pads arranged in a row, and the pads of each of the pad column units comprise:
a first pad, a second pad, and a third pad arranged sequentially along the first direction, wherein the first pad, the second pad, and the third pad of one of the pad column units and the first via hole, the second via hole, and the third via hole of one of the via hole column units are arranged in a staggered arrangement along the first direction.

22. The semiconductor package structure as claimed in claim 21, wherein the first pad of one of the pad column units is electrically connected to the first via hole and the second via hole of one of the via hole column units, and the second pad and the third pad of one of the pad column units are electrically connected to the third via hole of one of the via hole column units.

23. The semiconductor package structure as claimed in claim 21, wherein the first pad and the second pad of one of the pad column units are electrically connected to the first via hole of one of the via hole column units, and the third pad of one of the pad column units is electrically connected to the second via hole and the third via hole of one of the via hole column units.

* * * * *